(12) United States Patent
Bortolato

(10) Patent No.: US 12,314,647 B2
(45) Date of Patent: May 27, 2025

(54) DESIGNING PHOTONIC INTEGRATED CIRCUITS BASED ON ARRAYS OF INVERSE-DESIGNED COMPONENTS

(71) Applicant: X Development LLC, Mountain View, CA (US)

(72) Inventor: Cyril Bortolato, Mountain View, CA (US)

(73) Assignee: X Development LLC, Mountain View, CA (US)

( * ) Notice: Subject to any disclaimer, the term of this patent is extended or adjusted under 35 U.S.C. 154(b) by 480 days.

(21) Appl. No.: 17/828,864

(22) Filed: May 31, 2022

(65) Prior Publication Data
US 2023/0385499 A1   Nov. 30, 2023

(51) Int. Cl.
G06F 30/337 (2020.01)
(52) U.S. Cl.
CPC .................. *G06F 30/337* (2020.01)
(58) Field of Classification Search
USPC .......................................................... 716/118
See application file for complete search history.

(56) References Cited

U.S. PATENT DOCUMENTS

| | | | |
|---|---|---|---|
| 2022/0077948 A1 | 3/2022 | Lu et al. | |
| 2023/0079543 A1* | 3/2023 | Feng | G06F 30/23 703/20 |

FOREIGN PATENT DOCUMENTS

| | | |
|---|---|---|
| CN | 110717262 A | 1/2020 |
| CN | 112597657 A | 4/2021 |
| CN | 113128169 A | 7/2021 |
| CN | 113224537 A | 8/2021 |

OTHER PUBLICATIONS

PCT Search Report and Written Opinion mailed Sep. 12, 2023, in corresponding PCT Patent Application No. PCT/US2023/023610, 8 pages.
Richter, A., et al., "Automated design of large-scale photonic integrated circuits," SPIE, The International Society for Optics and Photonics, Jun. 23, 2015, 4 pages.
(Continued)

*Primary Examiner* — Bryce M Aisaka
(74) *Attorney, Agent, or Firm* — Christensen O'Connor Johnson Kindness PLLC

(57) ABSTRACT

In some embodiments, a method for designing a photonic device is provided. A design optimization system receives an initial design for the photonic device. The initial design includes one or more inputs, one or more outputs, a number of subcomponent regions, and a number of waveguides for connecting the subcomponent regions. The design optimization system simulates each subcomponent region to determine simulated s-parameters of each subcomponent region. The design optimization system determines overall s-parameters for a simulated photonic device based on the simulated s-parameters of each subcomponent region and s-parameters of the waveguides. The design optimization system determines an overall gradient associated with the overall s-parameters. The design optimization system optimizes one or more subcomponent regions based on the overall gradient to create an updated design for the photonic device.

20 Claims, 11 Drawing Sheets

(56) References Cited

OTHER PUBLICATIONS

Bogaerts, W., "Introduction to Silicon Photonics Circuit Design," Ghent University, Short Course 454—OFC 2018, pp. 1-171.

Shawon, M.J., et al., "Rapid Simulation of Photonic Integrated Circuits using Verilog-A Compact Models," IEEE 62nd International Midwest Symposium on Circuits and Systems, Dallas, Texas, Aug. 2019, 12 pages.

Filipsson, G., "A New General Computer Algorithm for S-Matrix Calculation of Interconnected Multiports," 1981 11th European Microwave Conference, 1981, pp. 700-704, doi: 10.1109/EUMA.1981.332972.

* cited by examiner

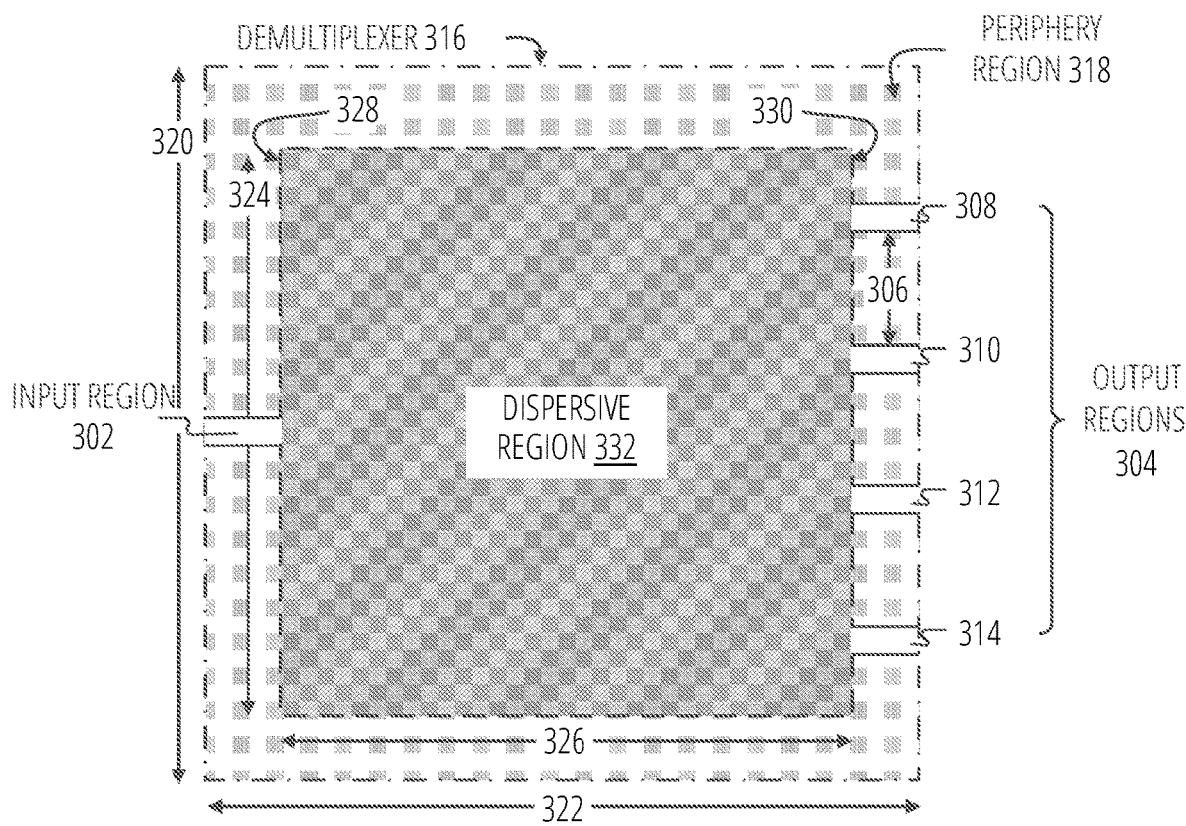
FIG. 3A
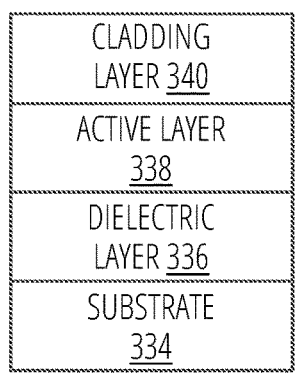 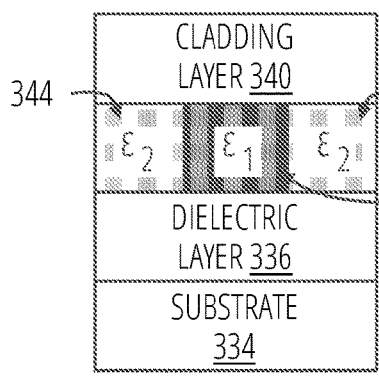 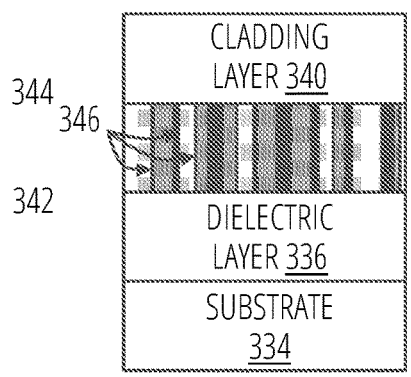
FIG. 3B  FIG. 3C  FIG. 3D

DESIGNING PHOTONIC INTEGRATED CIRCUITS BASED ON ARRAYS OF INVERSE-DESIGNED COMPONENTS

TECHNICAL FIELD

This disclosure relates generally to photonic devices, and in particular but not exclusively, relates to photonic integrated circuits, photonic multiplexers, and photonic demultiplexers.

BACKGROUND

Fiber-optic communication is typically employed to transmit information from one place to another via light that has been modulated to carry the information. For example, many telecommunication companies use optical fiber to transmit telephone signals, internet communication, and cable television signals. But the cost of deploying optical fibers for fiber-optic communication may be prohibitive. As such, techniques have been developed to more efficiently use the bandwidth available within a single optical fiber. Wavelength-division multiplexing is one such technique that bundles multiple optical carrier signals onto a single optical fiber using different wavelengths.

Further, digital logic has historically been implemented by constructing logic circuits out of electrical conductors and other electrical components. Other technologies have been sought in order to further increase speed, increase efficiency, and reduce size of digital logic. One such technology is the use of photonic devices to create photonic integrated circuits that manipulate light instead of electricity to create logic circuits.

BRIEF SUMMARY

In some embodiments, a non-transitory computer-readable medium is provided. The computer-readable medium has logic stored thereon that, in response to execution by one or more processors of a computing system cause the computing system to perform actions for designing a photonic device. The actions comprise receiving, by a design optimization system, an initial design for the photonic device, wherein the initial design includes one or more inputs, one or more outputs, a number of subcomponent regions, and a number of waveguides for connecting the subcomponent regions; simulating, by the design optimization system, each subcomponent region to determine simulated s-parameters of each subcomponent region; determining, by the design optimization system, overall s-parameters for a simulated photonic device based on the simulated s-parameters of each subcomponent region and s-parameters of the waveguides; determining, by the design optimization system, an overall gradient associated with the overall s-parameters; and optimizing, by the design optimization system, one or more subcomponent regions based on the overall gradient to create an updated design for the photonic device.

In some embodiments, a method for designing a photonic device is provided. A design optimization system receives an initial design for the photonic device. The initial design includes one or more inputs, one or more outputs, a number of subcomponent regions, and a number of waveguides for connecting the subcomponent regions. The design optimization system simulates each subcomponent region to determine simulated s-parameters of each subcomponent region. The design optimization system determines overall s-parameters for a simulated photonic device based on the simulated s-parameters of each subcomponent region and s-parameters of the waveguides. The design optimization system determines an overall gradient associated with the overall s-parameters. The design optimization system optimizes one or more subcomponent regions based on the overall gradient to create an updated design for the photonic device.

BRIEF DESCRIPTION OF THE SEVERAL VIEWS OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described. To easily identify the discussion of any particular element or act, the most significant digit or digits in a reference number refer to the figure number in which that element is first introduced.

FIG. 3A-FIG. 3D illustrate different views of a non-limiting example embodiment of a photonic demultiplexer, according to various aspects of the present disclosure.

DETAILED DESCRIPTION

Figure 1:
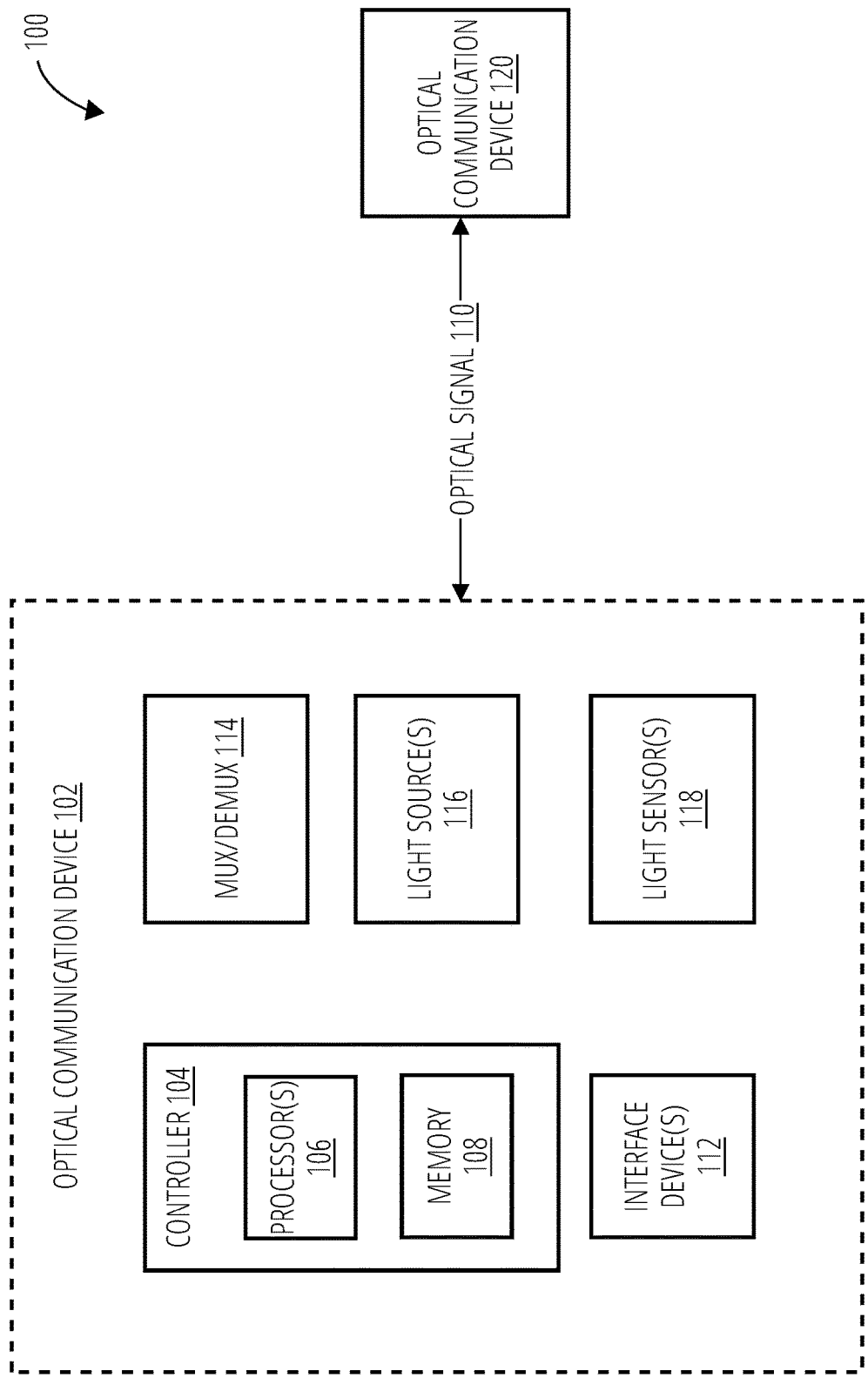
FIG. 1 is a functional block diagram illustrating a non-limiting example embodiment of a system for optical communication between two optical communication devices via an optical signal, according to various aspects of the present disclosure.

Embodiments of techniques for inverse design of physical devices are described herein, in the context of generating designs for photonic integrated circuits (including but not limited to multi-channel photonic demultiplexers, multi-channel photonic multiplexers, and photonic logic devices). In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Wavelength division multiplexing and its variants (e.g., dense wavelength division multiplexing, coarse wavelength division multiplexing, and the like) take advantage of the bandwidth of optical fibers by bundling multiple optical carrier signals onto a single optical fiber. Once the multiple carrier signals are bundled together, they are transmitted from one place to another over the single optical fiber where they may be demultiplexed to be read out by an optical communication device. However, devices that decouple the carrier signals from one another remain prohibitive in terms of cost, size, and the like.

Moreover, design of photonic devices, such as those used for optical communication, are traditionally designed via conventional techniques sometimes determined through a simple guess and check method or manually-guided grid-search in which a small number of design parameters from pre-determined designs or building blocks are adjusted for suitability to a particular application. However, in actuality, these devices may have design parameters ranging from hundreds all the way to many billions or more, dependent on the device size and functionality. Thus, as functionality of photonic devices increases and manufacturing tolerances improve to allow for smaller device feature sizes, it becomes increasingly important to take full advantage of these improvements via optimized device design.

Described herein are techniques for inverse design of a photonic integrated circuit (e.g., a multi-channel photonic demultiplexer and/or multiplexer and/or logic devices). More specifically, techniques described in embodiments herein utilize gradient-based optimization in combination with first-principle simulations to generate a design from an understanding of the underlying physics that are expected to govern the operation of the photonic integrated circuit. Embodiments and techniques described herein are not limited to conventional techniques used for design of photonic devices, in which a small number of design parameters for pre-determined building blocks are adjusted based on suitability to a particular application. Rather, the first-principles based designs described herein are not necessarily dependent on human intuition and generally may result in designs which outstrip current state-of-the-art designs in performance, size, robustness, or a combination thereof. Further still, rather than being limited to a small number of design parameters due to conventional techniques, the embodiments and techniques described herein may provide scalable optimization of a nearly unlimited number of design parameters. It will also be appreciated that, though the design and fabrication of photonic integrated circuits is described throughout the present text, similar inverse design techniques may be used to generate designs for other types of physical devices.

It is to be noted that, while providing a large design area with a large number of design parameters can increase the variety of functionality that can be achieved via inverse design of a photonic device, as the number of design parameters increases the amount of computing power consumed to simulate performance and update the design increases rapidly. In some embodiments of the present disclosure, techniques are provided that divide a large design area into smaller subcomponents which may be simulated in parallel, thereby greatly reducing the amount of computing power consumed and reducing the amount of time for optimizing designs.

FIG. 1 is a functional block diagram illustrating a system 100 for optical communication (e.g., via wavelength division multiplexing or other techniques) between optical communication device 102 and optical communication device 120 via optical signal 110, in accordance with various aspects of the present disclosure. More generally, optical communication device 102 is configured to transmit information by modulating light from one or more light sources into a multi-channel optical signal 110 (e.g., a singular optical signal that includes a plurality of distinct wavelength channels) that is subsequently transmitted from optical communication device 102 to optical communication device 120 via an optical fiber, a light guide, a wave guide, or other photonic device. Optical communication device 120 receives the multi-channel optical signal 110 and demultiplexes each of the plurality of distinct wavelength channels from the multi-channel optical signal 110 to extract the transmitted information. It is appreciated that in some embodiments optical communication device 102 and optical communication device 120 may be distinct and separate devices (e.g., an optical transceiver or transmitter communicatively coupled via one or more optical fibers to a separate optical transceiver or receiver). However, in other embodiments, optical communication device 102 and optical communication device 120 may be part of a singular component or device (e.g., a smartphone, a tablet, a computer, optical device, or the like). For example, optical communication device 102 and optical communication device 120 may both be constituent components on a monolithic integrated circuit that are coupled to one another via a waveguide that is embedded within the monolithic integrated circuit and is adapted to carry optical signal 110 between optical communication device 102 and optical communication device 120 or otherwise transmit the optical signal between one place and another. Further, in other embodiments, at least one of the optical communication device 102 and the optical communication device 120 may implement logic other than or in addition to wavelength multiplexing or demultiplexing.

In the illustrated embodiment, optical communication device 102 includes a controller 104, one or more interface device(s) 112 (e.g., fiber optic couplers, light guides, waveguides, and the like), a multiplexer (mux), demultiplexer (demux), or combination thereof (MUX/DEMUX 114), one or more light source(s) 116 (e.g., light emitting diodes, lasers, and the like), and one or more light sensor(s) 118 (e.g., photodiodes, phototransistors, photoresistors, and the like) coupled to one another. The controller includes one or more processor(s) 106 (e.g., one or more central processing units, application specific circuits, field programmable gate arrays, or otherwise) and memory 108 (e.g., volatile memory such as DRAM and SAM, non-volatile memory such as ROM, flash memory, and the like). It is appreciated that optical communication device 120 may include the same or similar elements as optical communication device 102, which have been omitted for clarity.

Controller 104 orchestrates operation of optical communication device 102 for transmitting and/or receiving optical signal 110 (e.g., a multi-channel optical signal having a plurality of distinct wavelength channels or otherwise). Controller 104 includes software (e.g., instructions included in memory 108 coupled to processor 106) and/or hardware logic (e.g., application specific integrated circuits, field-programmable gate arrays, and the like) that when executed by controller 104 causes controller 104 and/or optical communication device 102 to perform operations.

In one embodiment, controller 104 may choreograph operations of optical communication device 102 to cause light source(s) 116 to generate a plurality of distinct wavelength channels that are multiplexed via MUX/DEMUX 114 into a multi-channel optical signal 110 that is subsequently transmitted to optical communication device 120 via interface device 112. In other words, light source(s) 116 may output light having different wavelengths (e.g., 1271 nm, 1291 nm, 1311 nm, 1331 nm, 1506 nm, 1514 nm, 1551 nm, 1571, or otherwise) that may be modulated or pulsed via controller 104 to generate a plurality of distinct wavelength channels representative of information. The plurality of distinct wavelength channels are subsequently combined or otherwise multiplexed via MUX/DEMUX 114 into a multi-channel optical signal 110 that is transmitted to optical communication device 120 via interface device 112. In the same or another embodiment, controller 104 may choreograph operations of optical communication device 102 to cause a plurality of distinct wavelength channels to be demultiplexed via MUX/DEMUX 114 from a multi-channel optical signal 110 that is received via interface device 112 from optical communication device 120.

It is appreciated that in some embodiments certain elements of optical communication device 102 and/or optical communication device 120 may have been omitted to avoid obscuring certain aspects of the disclosure. For example, optical communication device 102 and optical communication device 120 may include amplification circuitry, lenses, or components to facilitate transmitting and receiving optical signal 110. It is further appreciated that in some embodiments optical communication device 102 and/or optical communication device 120 may not necessarily include all elements illustrated in FIG. 1. For example, in one embodiment optical communication device 102 and/or optical communication device 120 are passive devices that operate as an intermediary device that may passively multiplex a plurality of distinct wavelength channels into a multi-channel optical signal 110 and/or demultiplex a plurality of distinct wavelength channels from a multi-channel optical signal 110.

Figure 2A:
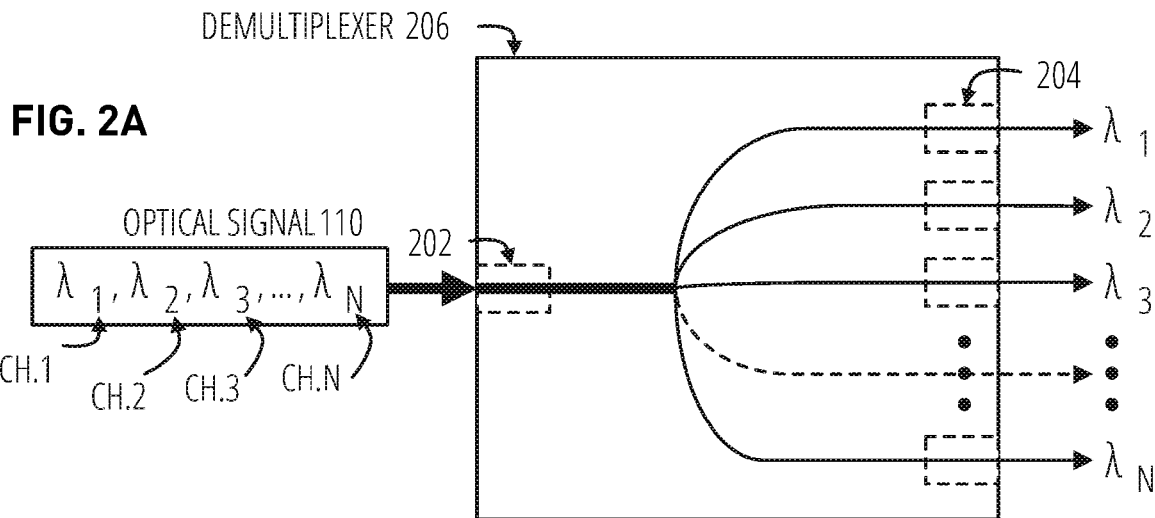
FIG. 2A and FIG. 2B respectively illustrate a non-limiting example embodiment of a demultiplexer and multiplexer, according to various aspects of the present disclosure.

FIG. 2A and FIG. 2A respectively illustrate an example demultiplexer 206 and multiplexer 208, in accordance with various aspects of the present disclosure. Demultiplexer 206 and multiplexer 208 are possible embodiments of MUX/DEMUX 114 illustrated in FIG. 1, and which may be part of an integrated photonic circuit, silicon photonic device, or otherwise As illustrated in FIG. 2A, demultiplexer 206 includes an input region 202 and a plurality of output regions 204. Demultiplexer 206 is configured to receive a multi-channel optical signal 110 that includes a plurality of distinct wavelength channels (e.g., Ch. 1, Ch. 2, Ch. 3, . . . Ch. N, each having a center wavelength respectively corresponding to $\lambda_1, \lambda_2, \lambda_3, \ldots, \lambda_N$) via input region 202 (e.g., a waveguide that may correspond to interface device 112 illustrated in FIG. 1) to optically separate each of the plurality of distinct wavelength channels from the multi-channel optical signal 110 and respectively guide each of the plurality of distinct wavelength channels to a corresponding one of a plurality of output regions 204 (e.g., a plurality of waveguides that may correspond to interface device(s) 112 illustrated in FIG. 1). More specifically, in the illustrated embodiment, each of the output regions 204 receives a portion of the multi-channel optical signal that corresponds to, or is otherwise representative of, one of the plurality of distinct wavelength channels that may be output as plurality of optical signals (e.g., $\lambda_1, \lambda_2, \lambda_3, \ldots, \lambda_N$). The plurality of output regions 204 may each be coupled to a respective light sensor (e.g., corresponding to light sensor(s) 118 illustrated in FIG. 1), which may be utilized to convert the optical signals demultiplexed from the multi-channel optical signal 110 into electrical signals for further processing.

Figure 2B:
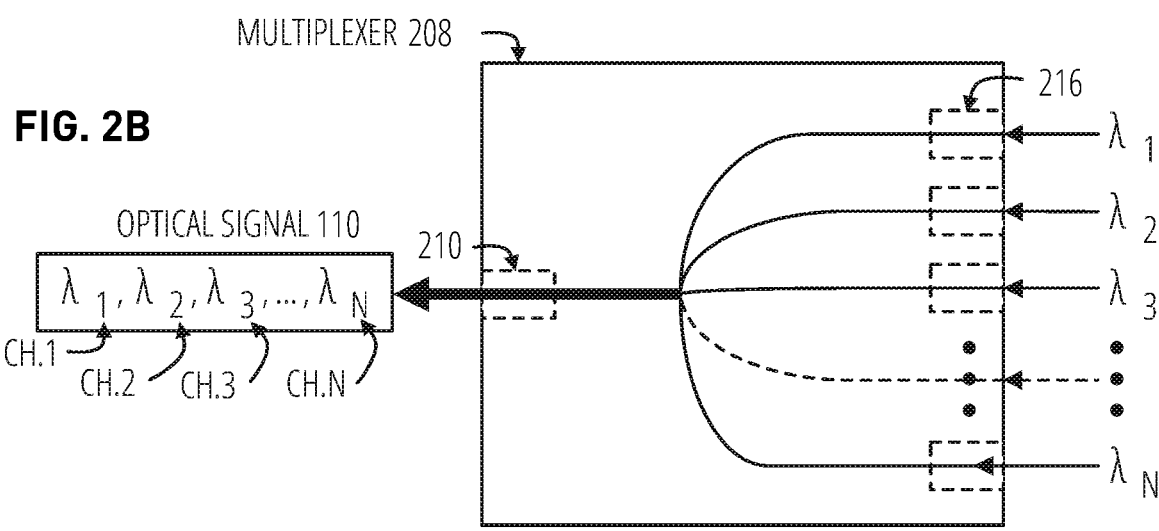

In the illustrated embodiment of FIG. 2B, multiplexer 208 includes a plurality of input regions 216 and an output region 210. Multiplexer 208 is configured to receive a plurality of distinct optical signals (e.g., $\lambda_1, \lambda_2, \lambda_3, \ldots, \lambda_N$), each at a respective one of the plurality of input regions 216 (e.g., a plurality of waveguides that may correspond to interface device(s) 112 illustrated in FIG. 1). Multiplexer 208 is structured or otherwise configured to optically combine (i.e., multiplex) each of the plurality of distinct wavelength channels into a multi-channel optical signal 110 that is guided to output region 210 (e.g., a waveguide that may correspond to interface device 112 illustrated in FIG. 1). It is appreciated that in some embodiments, demultiplexer 206 illustrated in FIG. 2A and multiplexer 208 illustrated in FIG. 2B may be bidirectional such that each device may function as both a demultiplexer and multiplexer.

Figure 2C:
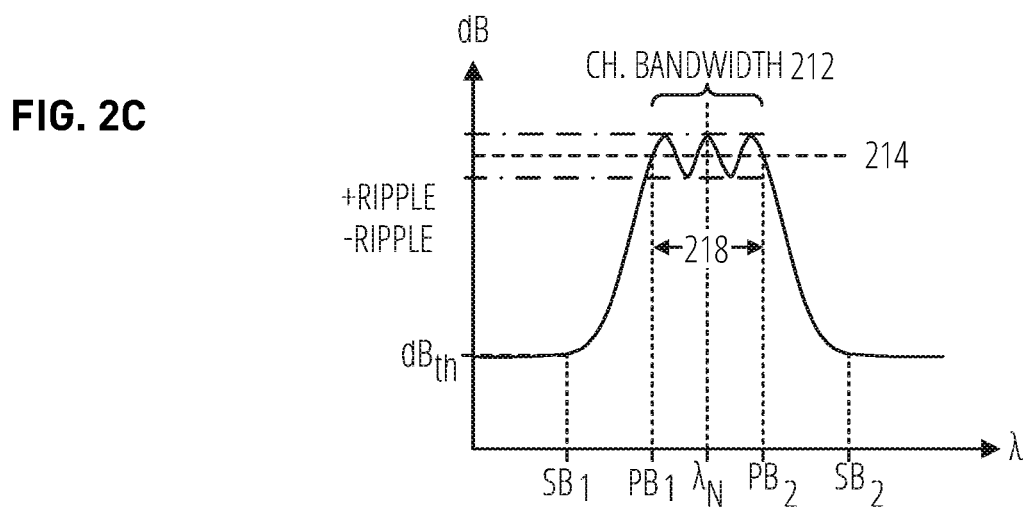
FIG. 2C illustrates a non-limiting example embodiment of a distinct wavelength channel of a multi-channel optical signal, according to various aspects of the present disclosure.

FIG. 2C illustrates an example distinct wavelength channel of a multi-channel optical signal (e.g., Ch. N is multi-channel optical signal 110 illustrated in FIG. 1, FIG. 2A, and FIG. 2B), in accordance with various aspects of the present disclosure. The example channel may be representative of an individual channel included in a plurality of distinct wavelength channels of the multi-channel optical signal that may be demultiplexed and/or multiplexed by demultiplexer 206 of FIG. 2A and/or multiplexer 208 of FIG. 2B. Each of the distinct wavelength channels may have different center wavelengths ($\lambda_N$) including at least one of 1271 nm, 1291 nm, 1311 nm, 1331 nm, 1506 nm, 1514 nm, 1551 nm, or 1571 nm, or otherwise. In the illustrated embodiment of FIG. 2C, the distinct wavelength channel has a channel bandwidth 212 of approximately 13 nm wide. However, in other embodiments the channel bandwidth may be different than 13 nm wide. Rather, the channel bandwidth may be considered a configurable parameter that is dependent upon the structure of MUX/DEMUX 114 of FIG. 1, demultiplexer 206 of FIG. 2A, and/or multiplexer 208 of FIG. 2B. For example, in some embodiments each of the plurality of distinct wavelength channels may share a common bandwidth that may correspond to 13 nm or otherwise. Referring back to FIG. 2C, the channel bandwidth 212 may be defined as the width of a passband region 218 (i.e., the region defined as being between $PB_1$ and $PB_2$). The passband region 218 may represent an approximate power transmission of a demultiplexer or multiplexer. It is appreciated that in some embodiments the passband region 218 may include ripple as illustrated in FIG. 2C, which corresponds to fluctuations within the passband region 218. In one or more embodiments, the ripple within the passband region around a central value 214 may be +/−2 dB or less, +/−1 dB or less, +/−0.5 dB or less, or otherwise. In some embodiments, the channel bandwidth 212 may be defined by the passband region 218. In other embodiments, the channel bandwidth 212 may be defined as the measured power above a threshold (e.g., $dB_{th}$). For example, demultiplexer 206 illustrated in FIG. 2A may optically separate channel N from multi-channel optical signal 110 and have a corresponding channel bandwidth for channel N equivalent to the range of wavelengths above a threshold value that are transmitted to the output region 204 mapped to channel N (i.e., $\lambda_N$). In the same or other embodiments, isolation of the channel (i.e., defined by channel bandwidth 212) may also be considered when optimizing the design. The isolation may be defined as a ratio between the passband region 218 and the stopband regions (e.g., regions less than $SB_1$ and greater than $SB_2$). It is further appreciated that transition band regions (e.g., a first transition region between $SB_1$ and $PB_1$ and a second transition region between $PB_2$ and $SB_2$) are exemplary and may be exaggerated for the purposes of illustration. In some embodiments, optimization of the design of the photonic demultiplexer may also include a target metric for a slope, width, or the like of the transition band regions.

FIG. 3A-FIG. 3D illustrate different views of an example photonic demultiplexer, in accordance with an embodiment of the present disclosure. Photonic demultiplexer 316 is one possible implementation of MUX/DEMUX 114 illustrated in FIG. 1 and demultiplexer 206 illustrated in FIG. 2A. It is further appreciated that while discussion henceforth may be directed towards photonic integrated circuits capable of demultiplexing a plurality of distinct wavelength channels from a multi-channel optical signal, that in other embodiments, a demultiplexer (e.g., demultiplexer 316) may also or alternatively be capable of multiplexing a plurality of distinct wavelength channels into a multi-channel optical signal, in accordance with embodiments of the present disclosure. Likewise, other embodiments may implement functionality other than multiplexing/demultiplexing, including but not limited to digital logic.

FIG. 3A illustrates a cross-sectional view of demultiplexer 316 along a lateral plane within an active layer defined by a width 320 and a length 322 of the demultiplexer 316. As illustrated, demultiplexer 316 includes an input region 302 (e.g., comparable to input region 202 illustrated in FIG. 2A), a plurality of output regions 304 (e.g., comparable to plurality of output regions 204 illustrated in FIG. 2A), and a dispersive region optically disposed between the input region 302 and plurality of output regions 304. The input region 302 and plurality of output regions 304 (e.g., output region 308, output region 310, output region 312, and output region 314) may each be waveguides (e.g., slab waveguide, strip waveguide, slot waveguide, or the like) capable of propagating light along the path of the waveguide. The dispersive region 332 includes a first material and a second material (see, e.g., FIG. 3D) inhomogeneously interspersed to form a plurality of interfaces that each correspond to a change in refractive index of the dispersive region 332 and collectively structure the dispersive region 332 to optically separate each of a plurality of distinct wavelength channels (e.g., Ch. 1, Ch. 2, Ch. 3, . . . Ch. N illustrated in FIG. 2A) from a multi-channel optical signal (e.g., optical signal 110 illustrated in FIG. 2A) and respectively guide each of the plurality of distinct wavelength channels to a corresponding one of the plurality of output regions 304 when the input region 302 receives the multi-channel optical signal. In other words, input region 302 is adapted to receive the multi-channel optical signal including a plurality of distinct wavelength channels and the plurality of output regions 304 are adapted to each receive a corresponding one of the plurality of distinct wavelength channels demultiplexed from the multi-channel optical signal via dispersive region 332.

Figure 4A:
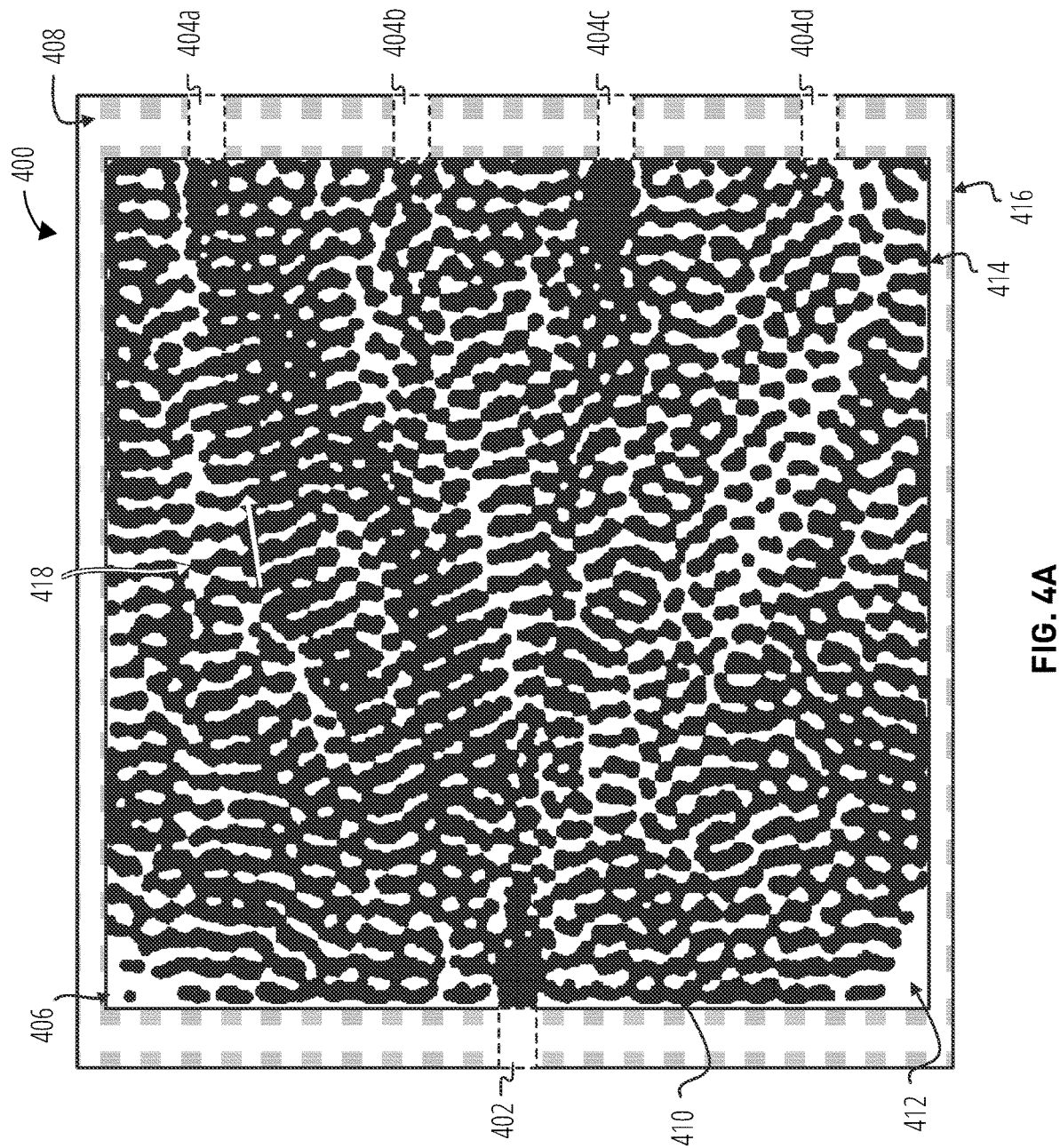
FIG. 4A and FIG. 4B illustrate a more detailed cross-sectional view of a dispersive region of a non-limiting example embodiment of a photonic demultiplexer, according to various aspects of the present disclosure.
Figure 4B:
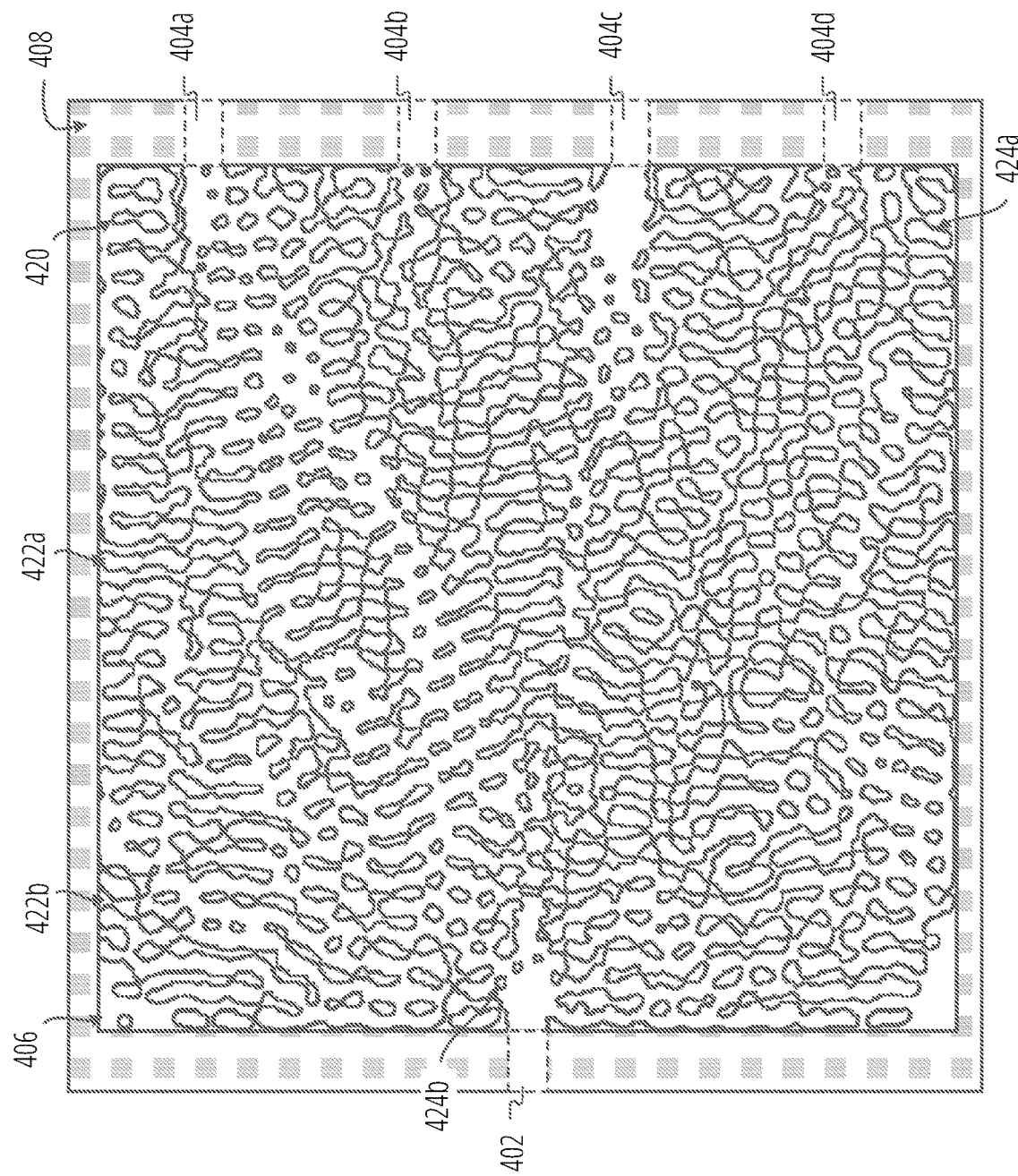

As illustrated in FIG. 3A, and more clearly shown in FIG. 3D and FIG. 4A-FIG. 4B, the shape and arrangement of the first and second material that are inhomogeneously interspersed create a plurality of interfaces that collectively form a material interface pattern along a cross-sectional area of dispersive region 332 that is at least partially surrounded by a periphery region 318 that includes the second material. In some embodiments periphery region 318 has a substantially homogeneous composition that includes the second material. In the illustrated embodiment, dispersive region 332 includes a first side 328 and a second side 330 that each interface with an inner boundary (i.e., the unlabeled dashed line of periphery region 318 disposed between dispersive region 332 and dashed-dotted line corresponding to an outer boundary of periphery region 318). First side 328 and second side 330 are disposed correspond to opposing sides of dispersive region 332. Input region 302 is disposed proximate to first side 328 (e.g., one side of input region 302 abuts first side 328 of dispersive region 332) while each of the plurality of output regions 304 are disposed proximate to second side 330 (e.g., one side of each of the plurality of output regions 304 abuts second side 330 of dispersive region 332).

In the illustrated embodiment each of the plurality of output regions 304 are parallel to each other one of the plurality of output regions 304. However, in other embodiments the plurality of output regions 304 may not be parallel to one another or even disposed on the same side (e.g., one or more of the plurality of output regions 304 and/or input region 302 may be disposed proximate to sides of dispersive region 332 that are adjacent to first side 328 and/or second side 330). In some embodiments adjacent ones of the plurality of output regions are separated from each other by a common separation distance when the plurality of output regions includes at least three output regions. For example, as illustrated adjacent output region 308 and output region 310 are separated from one another by distance 306, which may be common to the separation distance between other pairs of adjacent output regions.

As illustrated in the embodiment of FIG. 3A, demultiplexer 316 includes four output regions 304 (e.g., output region 308, output region 310, output region 312, output region 314) that are each respectively mapped (i.e., by virtue of the structure of dispersive region 332) to a respective one of four channels included in a plurality of distinct wavelength channels. More specifically, the plurality of interfaces of dispersive region 332, defined by the inhomogeneous interspersion of a first material and a second material, form a material interface pattern along a cross-sectional area of the dispersive region 332 (e.g., as illustrated in FIG. 3A, FIG. 4A, or FIG. 4B) to cause the dispersive region 332 to optically separate each of the four channels from the multi-channel optical signal and route each of the four channels to a respective one of the four output regions 304 when the input region 302 regions the multi-channel optical signal.

It is noted that the first material and second material of dispersive region 332 are arranged and shaped within the dispersive region such that the material interface pattern is substantially proportional to a design obtainable with an inverse design process, which will be discussed in greater detail later in the present disclosure. More specifically, in some embodiments, the inverse design process may include iterative gradient-based optimization of a design based at least in part on a loss function that incorporates a performance loss (e.g., to enforce functionality) and a fabrication loss (e.g., to enforce fabricability and binarization of a first material and a second material) that is reduced or otherwise adjusted via iterative gradient-based optimization to generate the design. In the same or other embodiment, other optimization techniques may be used instead of, or jointly with, gradient-based optimization. Advantageously, this allows for optimization of a near unlimited number of design parameters to achieve functionality and performance within a predetermined area that may not have been possible with conventional design techniques.

For example, in one embodiment dispersive region 332 is structured to optically separate each of the four channels from the multi-channel optical signal within a predetermined area of 35 µm×35 µm (e.g., as defined by width 324 and length 326 of dispersive region 332) when the input region 302 receives the multi-channel optical signal. In the same or another embodiment, the dispersive region is structured to accommodate a common bandwidth for each of the four channels, each of the four channels having different center wavelengths. In one embodiment the common bandwidth is approximately 13 nm wide and the different center wavelengths is selected from a group consisting of 1271 nm, 1291 nm, 1311 nm, 1331 nm, 1506 nm, 1514 nm, 1551 nm, and 1571 nm. In some embodiments, the entire structure of demultiplexer 316 (e.g., including input region 302, periphery region 318, dispersive region 332, and plurality of output regions 304) fits within a predetermined area (e.g., as defined by width 320 and length 322). In one embodiment the predetermined area is 35 µm×35 µm. It is appreciated that in other embodiments dispersive region 332 and/or demultiplexer 316 fits within other areas greater than or less than 35 µm×35 µm, which may result in changes to the structure of dispersive region 332 (e.g., the arrangement and shape of the first and second material) and/or other components of demultiplexer 316.

In the same or other embodiments the dispersive region is structured to have a power transmission of −2 dB or greater from the input region 302, through the dispersive region 332, and to the corresponding one of the plurality of output regions 304 for a given wavelength within one of the plurality of distinct wavelength channels. For example, if channel 1 of a multi-channel optical signal is mapped to output region 308, then when demultiplexer 316 receives the multi-channel optical signal at input region 302 the dispersive region 332 will optically separate channel 1 from the multi-channel optical signal and guide a portion of the multi-channel optical signal corresponding to channel 1 to output region 308 with a power transmission of −2 dB or greater. In the same or another embodiment, dispersive region 332 is structured such that an adverse power transmission (i.e., isolation) for the given wavelength from the input region to any of the plurality of output regions other than the corresponding one of the plurality of output regions is −30 dB or less, −22 dB or less, or otherwise. For example, if channel 1 of a multi-channel optical signal is mapped to output region 308, then the adverse power transmission from input region 302 to any other one of the plurality of output regions (e.g., output region 310, output region 312, output region 314) other than the corresponding one of the plurality of output regions (e.g., output region 308) is −30 dB or less, −22 dB or less, or otherwise. In some embodiments, a maximum power reflection from demultiplexer 316 of an input signal (e.g., a multi-channel optical signal) received at an input region (e.g., input region 302) is reflected back to the input region by dispersive region 332 or otherwise is −40 dB or less, −20 dB or less, −8 dB or less, or otherwise. It is appreciated that in other embodiments the power transmission, adverse power transmission, maximum power, or other performance characteristics may be different than the respective values discussed herein, but the structure of dispersive region 332 may change due to the intrinsic relationship between structure, functionality, and performance of demultiplexer 316.

FIG. 3B illustrates a vertical schematic or stack of various layers that are included in the illustrated embodiment of demultiplexer 316. However, it is appreciated that the illustrated embodiment is not exhaustive and that certain features or elements may be omitted to avoid obscuring certain aspects of the invention. In the illustrated embodiment, demultiplexer 316 includes substrate 334, dielectric layer 336, active layer 338 (e.g., as shown in the cross-sectional illustration of FIG. 3A), and a cladding layer 340. In some embodiments, demultiplexer 316 may be, in part or otherwise, a photonic integrated circuit or silicon photonic device that is compatible with conventional fabrication techniques (e.g., lithographic techniques such as photolithographic, electron-beam lithography and the like, sputtering, thermal evaporation, physical and chemical vapor deposition, and the like).

In one embodiment a silicon on insulator (SOI) wafer may be initially provided that includes a support substrate (e.g., a silicon substrate) that corresponds to substrate 334, a silicon dioxide dielectric layer that corresponds to dielectric layer 336, a silicon layer (e.g., intrinsic, doped, or otherwise), and a oxide layer (e.g., intrinsic, grown, or otherwise). In one embodiment, the silicon in the active layer 338 may be etched selectively by lithographically creating a pattern on the SOI wafer that is transferred to SOI wafer via a dry etch process (e.g., via a photoresist mask or other hard mask) to remove portions of the silicon. The silicon may be etched all the way down to dielectric layer 336 to form voids that may subsequently be backfilled with silicon dioxide that is subsequently encapsulated with silicon dioxide to form cladding layer 340. In one embodiment, there may be several etch depths including a full etch depth of the silicon to obtain the targeted structure. In one embodiment, the silicon may be 206 nm thick and thus the full etch depth may be 206 nm. In some embodiments, this may be a two-step encapsulation process in which two silicon dioxide depositions are performed with an intermediate chemical mechanical planarization used to yield a planar surface.

FIG. 3C illustrates a more detailed view of active layer 338 (relative to FIG. 3B) taken along a portion of periphery region 318 that includes input region 302 of FIG. 3A. In the illustrated embodiment, active layer 338 includes a first material 342 with a refractive index of $\varepsilon_1$ and a second material 344 with a refractive index of $\varepsilon_2$ that is different from $\varepsilon_1$. Homogenous regions of the first material 342 and the second material 344 may form waveguides or portions of waveguides that correspond to input region 302 and plurality of output regions 304 as illustrated in FIG. 3A and FIG. 3C.

FIG. 3D illustrates a more detailed view of active layer 338 (relative to FIG. 3B) taken along dispersive region 332. As described previously, active layer 338 includes a first material 342 (e.g., silicon) and a second material 344 (e.g., silicon dioxide) that are inhomogeneously interspersed to form a plurality of interfaces 346 that collectively form a material interface pattern. Each of the plurality of interfaces 346 that form the interface pattern correspond to a change in refractive index of dispersive region 332 to structure the dispersive region (i.e., the shape and arrangement of first material 342 and second material 344) to provide, at least in part, the functionality of demultiplexer 316 (i.e., optical separation of the plurality of distinct wavelength channels from the multi-channel optical signal and respective guidance of each of the plurality of distinct wavelength channels to the corresponding one of the plurality of output regions 304 when the input region 302 receives the multi-channel optical signal).

It is appreciated that in the illustrated embodiments of demultiplexer 316 as shown in FIG. 3A-FIG. 3D, the change in refractive index is shown as being vertically consistent (i.e., the first material 342 and second material 344 form interfaces that are substantially vertical or perpendicular to a lateral plane or cross-section of demultiplexer 316. However, in the same or other embodiments, the plurality of interfaces (e.g., interfaces 346 illustrated in FIG. 3D) may not be substantially perpendicular with the lateral plane or cross-section of demultiplexer 316.

FIG. 4A illustrates a more detailed cross-sectional view of a dispersive region of example photonic demultiplexer 400, in accordance with an embodiment of the present disclosure. FIG. 4B illustrates a more detailed view of an interface pattern formed by the shape and arrangement of a first material 410 and a second material 412 for the dispersive region of the photonic demultiplexer 400 of FIG. 4A. Photonic demultiplexer 400 is one possible implementation of MUX/DEMUX 114 illustrated in FIG. 1, demultiplexer 206 illustrated in FIG. 2A, and demultiplexer 316 illustrated in FIG. 3A-FIG. 3D.

As illustrated in FIG. 4A and FIG. 4B, photonic demultiplexer 400 includes an input region 402, a plurality of output regions 404a-404d, and a dispersive region 406 optically disposed between input region 402 and plurality of output regions 404a-404d. Dispersive region 406 is surrounded, at least in part, by a peripheral region 408 that includes an inner boundary 414 and an outer boundary 416. It is appreciated that like named or labeled elements of photonic demultiplexer 400 may similarly correspond to like named or labeled elements of other demultiplexers described in embodiments of the present disclosure.

The first material 410 (i.e., black colored regions within dispersive region 406) and second material 412 (i.e., white colored regions within dispersive region 406) of photonic demultiplexer 400 are inhomogeneously interspersed to create a plurality of interfaces that collectively form material interface pattern 420 as illustrated in FIG. 4B. More specifically, an inverse design process that utilizes iterative gradient-based optimization, Markov Chain Monte Carlo optimization, or other optimization techniques combined with first principles simulations to generate a design that is substantially replicated by dispersive region 406 within a proportional or scaled manner such that photonic demultiplexer 400 provides the desired functionality. In the illustrated embodiment, dispersive region 406 is structured to optically separate each of a plurality of distinct wavelength channels from a multi-channel optical signal and respectively guide each of the plurality of distinct wavelength channels to a corresponding one of the plurality of output regions 404a-404d when the input region 402 receives the multi-channel optical signal. More specifically, the plurality of output regions 404a-404d are respectively mapped to wavelength channels having center wavelengths correspond to 1271 nm, 1291 nm, 1311 nm, and 1331 nm. In another embodiment, output regions 404a-404d are respectfully mapped to wavelength channels having center wavelengths that correspond to 1506 nm, 1514 nm, 1551 nm, and 1571 nm.

As illustrated in FIG. 4B, material interface pattern 420, which is defined by the black lines within dispersive region 406 and corresponds to a change in refractive index within dispersive region 406, includes a plurality of protrusions 422a-422b. A first protrusion 422a is formed of the first material 410 and extends from peripheral region 408 into dispersive region 406. Similarly, a second protrusion 422b is formed of the second material 412 and extends from peripheral region 408 into dispersive region 406. Further illustrated in FIG. 4B, dispersive region 406 includes a plurality of islands 424a-424b formed of either the first material 410 or the second material 412. The plurality of islands 424a-424b include a first island 424a that is formed of the first material 410 and is surrounded by the second material 412. The plurality of islands 424a-424b also includes a second island 424b that is formed of the second material 412 and is surrounded by the first material 410.

In some embodiments, material interface pattern 420 includes one or more dendritic shapes, wherein each of the one or more dendritic shapes are defined as a branched structure formed from first material 410 or second material 412 and having a width that alternates between increasing and decreasing in size along a corresponding direction. Referring back to FIG. 4A, for clarity, dendritic structure 418 is labeled with a white arrow having a black border. As can be seen, the width of dendritic structure 418 alternatively increases and decreases in size along a corresponding direction (i.e., the white labeled arrow overlaying a length of dendritic structure 418) to create a branched structure. It is appreciated that in other embodiments there may be no protrusions, there may be no islands, there may be no dendritic structures, or there may be any number, including zero, of protrusions, islands of any material included in the dispersive region 406, dendritic structures, or a combination thereof.

In some embodiments, the inverse design process includes a fabrication loss that enforces a minimum feature size, for example, to ensure fabricability of the design. In the illustrated embodiment of photonic demultiplexer 400 illustrated in FIG. 4A and FIG. 4B, material interface pattern 420 is shaped to enforce a minimum feature size within dispersive region 406 such that the plurality of interfaces within the cross-sectional area formed with first material 410 and second material 412 do not have a radius of curvature with a magnitude of less than a threshold size. For example, if the minimum feature size is 150 nm, the radius of curvature for any of the plurality of interfaces have a magnitude of less than the threshold size, which corresponds the inverse of half the minimum feature size (i.e., $1/75$ nm$^{-1}$). Enforcement of such a minimum feature size prevents the inverse design process from generating designs that are not fabricable by considering manufacturing constraints, limitations, and/or yield. In the same or other embodiments, different or additional checks on metrics related to fabricability may be utilized to enforce a minimum width or spacing as a minimum feature size.

Figure 5:
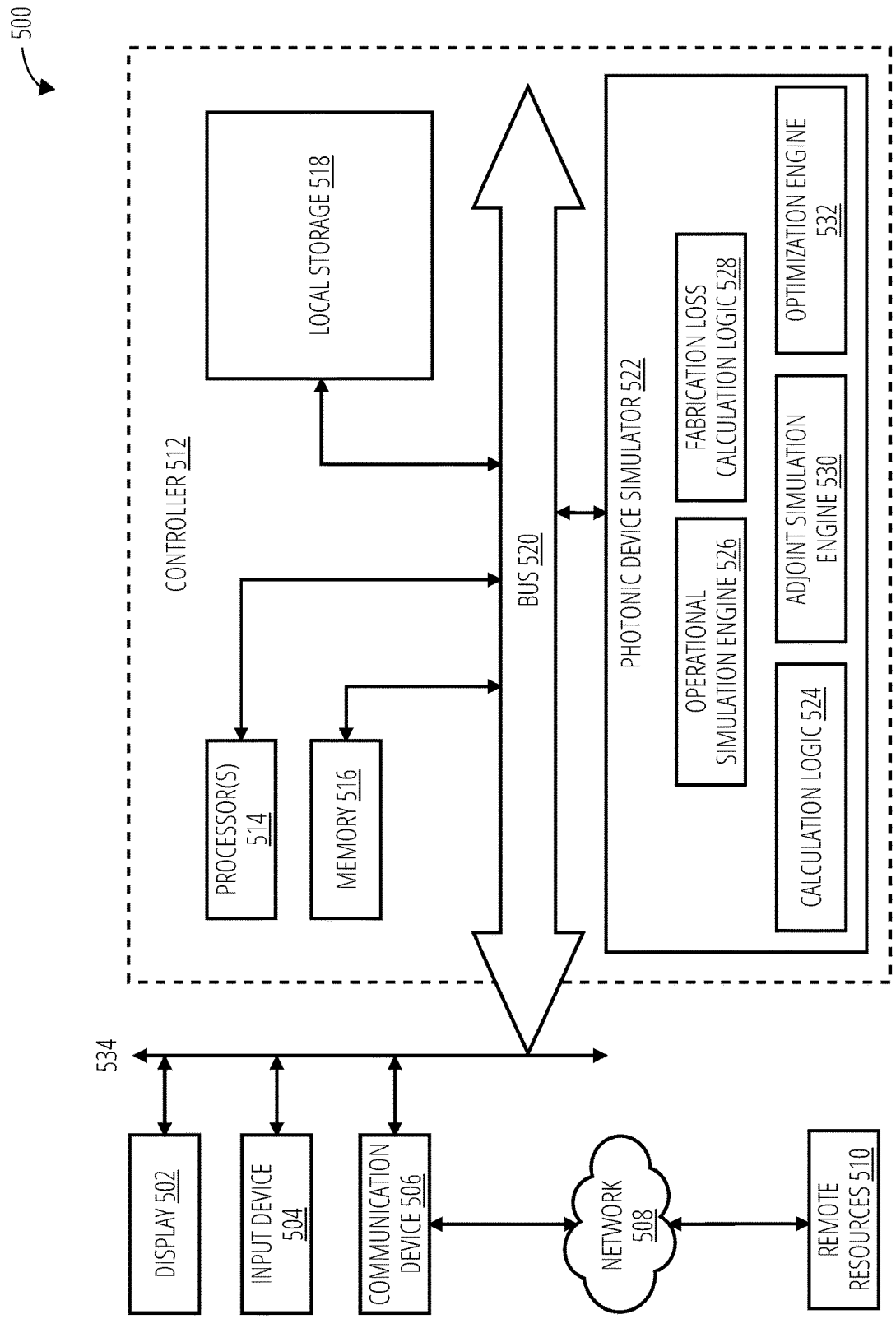
FIG. 5 is a functional block diagram illustrating a non-limiting example embodiment of a system for generating a design of a photonic integrated circuit, according to various aspects of the present disclosure.

FIG. 5 is a functional block diagram illustrating a system 500 for generating a design of a photonic integrated circuit (i.e., photonic device), in accordance with an embodiment of the disclosure. System 500 may be utilized to perform an inverse design process that generates a design with iterative gradient-based optimization that takes into consideration the underlying physics that govern the operation of the photonic integrated circuit. More specifically, system 500 is a design tool that may be utilized to optimize structural parameters (e.g., shape and arrangement of a first material and a second material within the dispersive region of the embodiments described in the present disclosure) of photonic integrated circuits based on first-principles simulations (e.g., electromagnetic simulations to determine a field response of the photonic device to an excitation source) and iterative gradient-based optimization. In other words, system 500 may provide a design obtained via the inverse design process that is substantially replicated (i.e., proportionally scaled) by dispersive region 332 and dispersive region 406 of demultiplexer 316 and photonic demultiplexer 400 illustrated in FIG. 3A and FIG. 4A, respectively.

As illustrated, system 500 includes controller 512, display 502, input device(s) 504, communication device(s) 506, network 508, remote resources 510, bus 534, and bus 520. Controller 512 includes processor 514, memory 516, local storage 518, and photonic device simulator 522. Photonic device simulator 522 includes operational simulation engine 526, fabrication loss calculation logic 528, calculation logic 524, adjoint simulation engine 530, and optimization engine 532. It is appreciated that in some embodiments, controller 512 may be a distributed system.

Controller 512 is coupled to display 502 (e.g., a light emitting diode display, a liquid crystal display, and the like) coupled to bus 534 through bus 520 for displaying information to a user utilizing system 500 to optimize structural parameters of the photonic device (i.e., demultiplexer). Input device 504 is coupled to bus 534 through bus 520 for communicating information and command selections to processor 514. Input device 504 may include a mouse, trackball, keyboard, stylus, or other computer peripheral, to facilitate an interaction between the user and controller 512. In response, controller 512 may provide verification of the interaction through display 502.

Another device, which may optionally be coupled to controller 512, is a communication device 506 for accessing remote resources 510 of a distributed system via network 508. Communication device 506 may include any of a number of networking peripheral devices such as those used for coupling to an Ethernet, Internet, or wide area network, and the like. Communication device 506 may further include a mechanism that provides connectivity between controller 512 and the outside world. Note that any or all of the components of system 500 illustrated in FIG. 5 and associated hardware may be used in various embodiments of the present disclosure. The remote resources 510 may be part of a distributed system and include any number of processors, memory, and other resources for optimizing the structural parameters of the photonic device.

Controller 512 orchestrates operation of system 500 for optimizing structural parameters of the photonic device. Processor 514 (e.g., one or more central processing units, graphics processing units, and/or tensor processing units, etc.), memory 516 (e.g., volatile memory such as DRAM and SRAM, non-volatile memory such as ROM, flash memory, and the like), local storage 518 (e.g., magnetic memory such as computer disk drives), and the photonic device simulator 522 are coupled to each other through bus 520. Controller 512 includes software (e.g., instructions included in memory 516 coupled to processor 514) and/or hardware logic (e.g., application specific integrated circuits, field-programmable gate arrays, and the like) that when executed by controller 512 causes controller 512 or system 500 to perform operations. The operations may be based on instructions stored within any one of, or a combination of, memory 516, local storage 518, physical device simulator 522, and remote resources 510 accessed through network 508.

In the illustrated embodiment, the components of photonic device simulator 522 are utilized to optimize structural parameters of the photonic device (e.g., MUX/DEMUX 114 of FIG. 1, demultiplexer 206 of FIG. 2A, multiplexer 208 of FIG. 2B, demultiplexer 316 of FIG. 3A-FIG. 3D, and photonic demultiplexer 400 of FIG. 4A-FIG. 4B). In some embodiments, system 500 may optimize the structural parameters of the photonic device via, inter alia, simulations (e.g., operational and adjoint simulations) that utilize a finite-difference time-domain (FDTD) method, a finite-difference frequency-domain (FDFD) method, or any other suitable technique to model the field response (e.g., electric and magnetic fields within the photonic device). The operational simulation engine 526 provides instructions for performing an electromagnetic simulation of the photonic device operating in response to an excitation source within a simulated environment. In particular, the operational simulation determines a field response of the simulated environment (and thus the photonic device, which is described by the simulated environment) in response to the excitation source for determining a performance metric of the physical device (e.g., based off an initial description or input design of the photonic device that describes the structural parameters of the photonic device within the simulated environment with a plurality of voxels). The structural parameters may correspond, for example, to the specific design, material compositions, dimensions, and the like of the physical device. Fabrication loss calculation logic 528 provides instructions for determining a fabrication loss, which is utilized to enforce a minimum feature size to ensure fabricability. In some embodiments, the fabrication loss is also used to enforce binarization of the design (i.e., such that the photonic device includes a first material and a second material that are interspersed to form a plurality of interfaces). Calculation logic 524 computes a loss metric determined via a loss function that incorporates a performance loss, based on the performance metric, and the fabrication loss. Adjoint simulation engine 530 is utilized in conjunction with the operational simulation engine 526 to perform an adjoint simulation of the photonic device to backpropagate the loss metric through the simulated environment via the loss function to determine how changes in the structural parameters of the photonic device influence the loss metric. Optimization engine 532 is utilized to update the structural parameters of the photonic device to reduce the loss metric and generate a revised description (i.e., revising the design) of the photonic device.

Figure 6A:
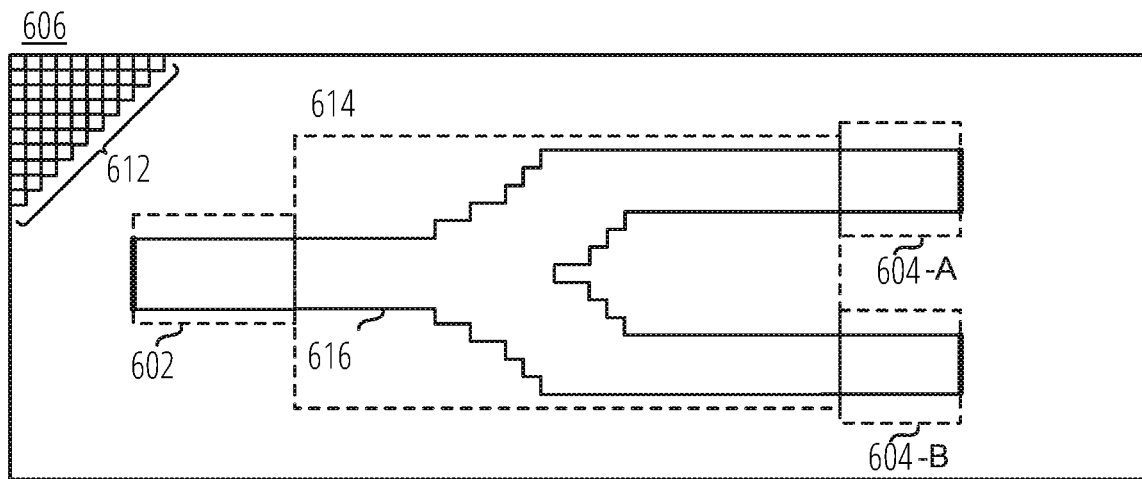
FIG. 6A illustrates a non-limiting example embodiment of a simulated environment describing a photonic integrated circuit, according to various aspects of the present disclosure.
Figure 6B:
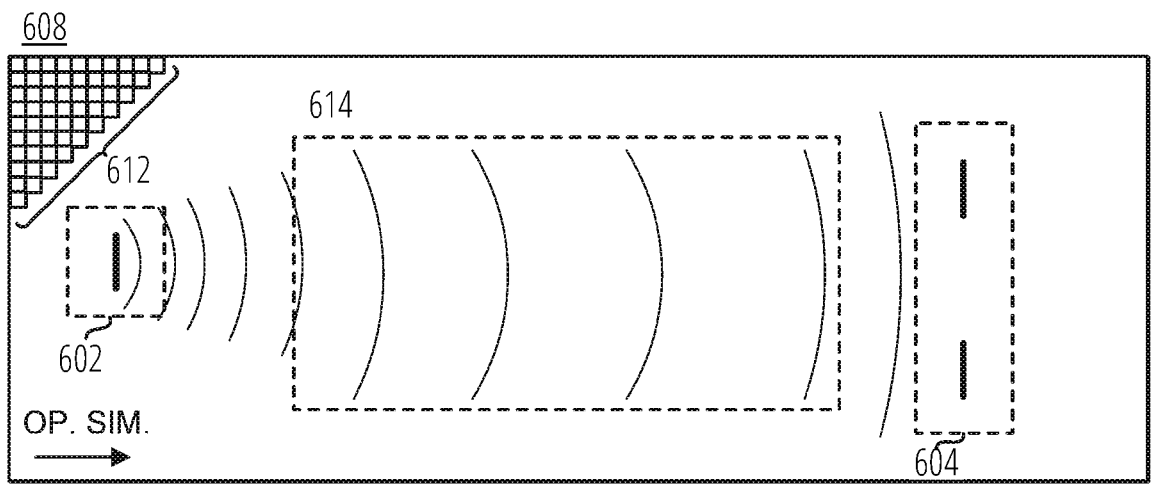
FIG. 6B illustrates a non-limiting example embodiment of an operational simulation of a photonic integrated circuit, according to various aspects of the present disclosure.
Figure 6C:
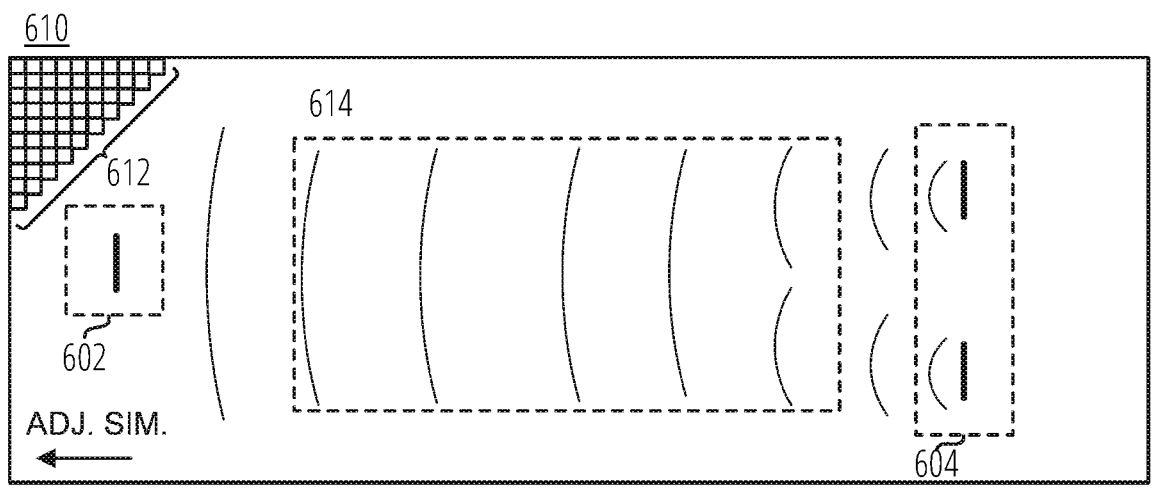
FIG. 6C illustrates a non-limiting example embodiment of an adjoint simulation within the simulated environment by backpropagating a loss value, according to various aspects of the present disclosure.

FIG. 6A-FIG. 6C respectively illustrate non-limiting example embodiments of an initial set up of a simulated environment 606 describing a photonic device, performing an operational simulation of the photonic device in response to an excitation source within the simulated environment 608, and performing an adjoint simulation of the photonic device within the simulated environment 610 according to various aspects of the present disclosure. The initial set up of the simulated environment, 1-dimensional representation of the simulated environment, operational simulation of the physical device, and adjoint simulation of the physical device may be implemented with system 500 illustrated in FIG. 5.

As illustrated in FIG. 6A-FIG. 6C, simulated environment is represented in two-dimensions. However, it is appreciated that other dimensionality (e.g., 3-dimensional space) may also be used to describe simulated environment and the photonic device. In some embodiments, optimization of structural parameters of the photonic device illustrated in FIG. 6A-FIG. 6C may be achieved via an inverse design process including, inter alia, simulations (e.g., operational simulations and adjoint simulations) that utilize a finite-difference time-domain (FDTD) method, a finite-difference frequency-domain (FDFD) method, or any other suitable technique to model the field response (e.g., electric and magnetic field) to an excitation source.

FIG. 6A illustrates a demonstrative simulated environment 606 describing a photonic integrated circuit (i.e., a photonic device such as a waveguide, demultiplexer, and the like), in accordance with a non-limiting example embodiment of the present disclosure. More specifically, in response to receiving an initial description of a photonic device defined by one or more structural parameters (e.g., an input design), a system (e.g., system 500 of FIG. 5) configures a simulated environment 606 to be representative of the photonic device. As illustrated, the simulated environment 606 (and subsequently the photonic device) is described by a plurality of voxels 612, which represent individual elements (i.e., discretized) of the two-dimensional (or other dimensionality) space. Each of the voxels 612 is illustrated as a two-dimensional square; however, it is appreciated that the voxels may be represented as cubes or other shapes in three-dimensional space. It is appreciated that the specific shape and dimensionality of the plurality of voxels 612 may be adjusted dependent on the simulated environment 606 and photonic device being simulated. It is further noted that only a portion of the plurality of voxels 612 are illustrated to avoid obscuring other aspects of the simulated environment 606.

Each of the plurality of voxels 612 may be associated with a structural value, a field value, and a source value. Collectively, the structural values of the simulated environment 606 describe the structural parameters of the photonic device. In one embodiment, the structural values may correspond to a relative permittivity, permeability, and/or refractive index that collectively describe structural (i.e., material) boundaries or interfaces of the photonic device (e.g., material interface pattern 420 of FIG. 4B). For example, an interface 616 is representative of where relative permittivity changes within the simulated environment 606 and may define a boundary of the photonic device where a first material meets or otherwise interfaces with a second material. The field value describes the field (or loss) response that is calculated (e.g., via Maxwell's equations) in response to an excitation source described by the source value. The field response, for example, may correspond to a vector describing the electric and/or magnetic fields (e.g., in one or more orthogonal directions) at a particular time step for each of the plurality of voxels 612. Thus, the field response may be based, at least in part, on the structural parameters of the photonic device and the excitation source.

In the illustrated embodiment, the photonic device corresponds to an optical demultiplexer having a design region 614 (e.g., corresponding to dispersive region 332 of FIG. 3A, and/or dispersive region 406 of FIG. 4A), in which structural parameters of the physical device may be updated or otherwise revised. More specifically, through an inverse design process, iterative gradient-based optimization of a loss metric determined from a loss function is performed to generate a design of the photonic device that functionally causes a multi-channel optical signal to be demultiplexed and guided from input port 602 to a corresponding one of the output ports 604. Thus, input port 602 (e.g., corresponding to input region 302 of FIG. 3A, input region 402 of FIG. 4A, and the like) of the photonic device corresponds to a location of an excitation source to provide an output (e.g., a Gaussian pulse, a wave, a waveguide mode response, and the like). The output of the excitation source interacts with the photonic device based on the structural parameters (e.g., an electromagnetic wave corresponding to the excitation source may be perturbed, retransmitted, attenuated, refracted, reflected, diffracted, scattered, absorbed, dispersed, amplified, or otherwise as the wave propagates through the photonic device within simulated environment 606). In other words, the excitation source may cause the field response of the photonic device to change, which is dependent on the underlying physics governing the physical domain and the structural parameters of the photonic device. The excitation source originates or is otherwise proximate to input port 602 and is positioned to propagate (or otherwise influence the field values of the plurality of voxels) through the design region 614 towards output ports 604 of the photonic device. In the illustrated embodiment, the input port 602 and output ports 604 are positioned outside of the design region 614. In other words, in the illustrated embodiment, only a portion of the structural parameters of the photonic device is optimizable.

However, in other embodiments, the entirety of the photonic device may be placed within the design region 614 such that the structural parameters may represent any portion or the entirety of the design of the photonic device. The electric and magnetic fields within the simulated environment 606 (and subsequently the photonic device) may change (e.g., represented by field values of the individual voxels that collectively correspond to the field response of the simulated environment) in response to the excitation source. The output ports 604 of the optical demultiplexer may be used for determining a performance metric of the photonic device in response to the excitation source (e.g., power transmission from input port 602 to a specific one of the output ports 604). The initial description of the photonic device, including initial structural parameters, excitation source, performance parameters or metrics, and other parameters describing the photonic device, are received by the system (e.g., system 500 of FIG. 5) and used to configure the simulated environment 606 for performing a first-principles based simulation of the photonic device. These specific values and parameters may be defined directly by a user (e.g., of system 500 in FIG. 5), indirectly (e.g., via controller 512 culling pre-determined values stored in memory 516, local storage 518, or remote resources 510), or a combination thereof.

FIG. 6B illustrates a non-limiting example embodiment of an operational simulation of the photonic device in response to an excitation source within simulated environment 608, in accordance with various aspects of the present disclosure. In the illustrated embodiment, the photonic device is an optical demultiplexer structured to optically separate each of a plurality of distinct wavelength channels included in a multi-channel optical signal received at input port 602 and respectively guide each of the plurality of distinct wavelength channels to a corresponding one of the plurality of output ports 604. The excitation source may be selected (randomly or otherwise) from the plurality of distinct wavelength channels and originates at input port 602 having a specified spatial, phase, and/or temporal profile. The operational simulation occurs over a plurality of time steps, including the illustrated time step. When performing the operational simulation, changes to the field response (e.g., the field value) for each of the plurality of voxels 612 are incrementally updated in response to the excitation source over the plurality of time steps. The changes in the field response at a particular time step are based, at least in part, on the structural parameters, the excitation source, and the field response of the simulated environment 610 at the immediately prior time step included in the plurality of time steps. Similarly, in some embodiments the source value of the plurality of voxels 612 is updated (e.g., based on the spatial profile and/or temporal profile describing the excitation source). It is appreciated that the operational simulation is incremental and that the field values (and source values) of the simulated environment 610 are updated incrementally at each time step as time moves forward for each of the plurality of time steps during the operational simulation. It is further noted that in some embodiments, the update is an iterative process and that the update of each field and source value is based, at least in part, on the previous update of each field and source value.

Once the operational simulation reaches a steady state (e.g., changes to the field values in response to the excitation source substantially stabilize or reduce to negligible values) or otherwise concludes, one or more performance metrics may be determined. In one embodiment, the performance metric corresponds to the power transmission at a corresponding one of the output ports 604 mapped to the distinct wavelength channel being simulated by the excitation source. In other words, in some embodiments, the performance metric represents power (at one or more frequencies of interest) in the target mode shape at the specific locations of the output ports 604. A loss value or metric of the input design (e.g., the initial design and/or any refined design in which the structural parameters have been updated) based, at least in part, on the performance metric may be determined via a loss function. The loss metric, in conjunction with an adjoint simulation, may be utilized to determine a structural gradient (e.g., influence of structural parameters on loss metric) for updating or otherwise revising the structural parameters to reduce the loss metric (i.e. increase the performance metric). It is noted that the loss metric may be further based on a fabrication loss value that is utilized to enforce a minimum feature size of the photonic device to promote fabricability of the device, and/or other loss values.

FIG. 6C illustrates a non-limiting example embodiment of an adjoint simulation within simulated environment 610 by backpropagating a loss metric, in accordance with various aspects of the present disclosure. More specifically, the adjoint simulation is a time-backwards simulation in which a loss metric is treated as an excitation source that interacts with the photonic device and causes a loss response. In other words, an adjoint (or virtual source) based on the loss metric is placed at the output region (e.g., output ports 604) or other location that corresponds to a location used when determining the performance metric. The adjoint source(s) is then treated as a physical stimuli or an excitation source during the adjoint simulation. A loss response of the simulated environment 608 is computed for each of the plurality of time steps (e.g., backwards in time) in response to the adjoint source. The loss response collectively refers to loss values of the plurality of voxels 612 that are incrementally updated in response to the adjoint source over the plurality of time steps. The change in loss response based on the loss metric may correspond to a loss gradient, which is indicative of how changes in the field response of the physical device influence the loss metric. The loss gradient and the field gradient may be combined in the appropriate way to determine a structural gradient of the photonic device/simulated environment (e.g., how changes in the structural parameters of the photonic device within the simulated environment influence the loss metric). Once the structural gradient of a particular cycle (e.g., operational and adjoint simulation) is known, the structural parameters may be updated to reduce the loss metric and generate a revised description or design of the photonic device.

In some embodiments, iterative cycles of performing the operational simulation, and adjoint simulation, determining the structural gradient, and updating the structural parameters to reduce the loss metric are performed successively as part of an inverse design process that utilizes iterative gradient-based optimization. An optimization scheme such as gradient descent may be utilized to determine specific amounts or degrees of changes to the structural parameters of the photonic device to incrementally reduce the loss metric. More specifically, after each cycle the structural parameters are updated (e.g., optimized) to reduce the loss metric. The operational simulation, adjoint simulation, and updating the structural parameters are iteratively repeated until the loss metric substantially converges or is otherwise below or within a threshold value or range such that the photonic device provides the desired performed while maintaining fabricability.

Though the inverse design process described above is effective, as the design region 614 increases in size, the amount of computing time consumed to perform the operational simulation, adjoint simulation, gradient determination, and structural parameter update increases greatly. Further, the number of iterations before the loss metric converges may rise as the design region 614 increases in size as well. Unfortunately, for some desired functionality (e.g., multiplexing/demultiplexing specific wavelengths, and/or multiplexing/demultiplexing specific numbers of wavelengths from each other, and/or implementing digital logic), a smaller design region 614 may not provide adequate physical area for the desired functionality to be implemented. For example, given the physical characteristics of propagation of a wave through the design region 614, a minimum distance may be needed for the wave to be translated from a first position or orientation to a second position or orientation. That said, increasing the area of the design region 614 too much can cause the computation of simulations and gradients to take more computing resources than will provide practical results.

Accordingly, in some embodiments of the present disclosure, simulation and optimization of a large design region 614 may be accomplished by breaking the design region into subcomponent regions connected by waveguides. Simulation and optimization of each subcomponent region may be concurrently calculated, and simulation of the waveguides may be pre-computed in order to accelerate simulation and optimization of the overall design. The overall size of the design region, even when broken into subcomponent regions, is still available for implementing functionality, and so the benefits of a large design region are maintained while computation time is dramatically reduced.

Figure 7:
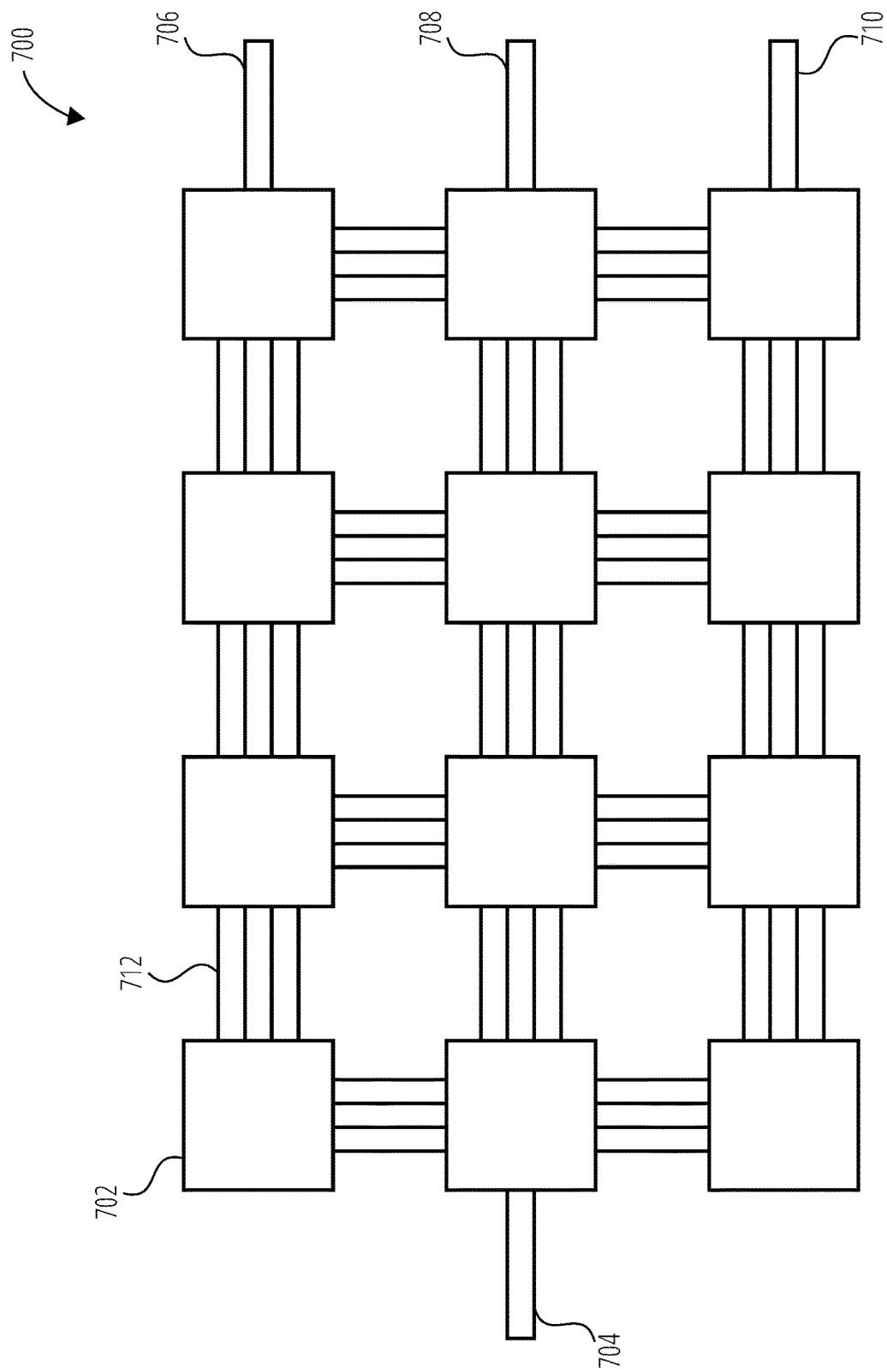
FIG. 7 is a schematic that illustrates a non-limiting example embodiment of a design region for a photonic integrated circuit divided into subcomponent regions according to various aspects of the present disclosure.

FIG. 7 is a schematic that illustrates a non-limiting example embodiment of a design region for a photonic integrated circuit divided into subcomponent regions according to various aspects of the present disclosure. In the photonic integrated circuit 700, an input waveguide 704, a first output waveguide 706, a second output waveguide 708, and a third output waveguide 710 are provided around a design region, similar to the input region 402 and output regions 404a-404d illustrated in FIG. 4A and FIG. 4B, and the input port 602/output ports 604 illustrated in FIG. 6A-FIG. 6C. However, instead of a single monolithic design region 614 as illustrated in previous figures, the design region of the photonic integrated circuit 700 is divided into a plurality of subcomponent regions 702.

In the illustrated embodiment, each of the subcomponent regions 702 is of a matching size. By selecting a matching size for the subcomponent regions 702, concurrent simulations of each of the subcomponent regions 702 will be completed at substantially the same time, and because each of the subcomponent regions 702 is so much smaller than the overall design region, the computing resources for simulating each subcomponent region 702 is dramatically reduced compared to the entire design region (particularly considering that the computational complexity of the simulation is exponential with respect to the simulated area).

The photonic integrated circuit 700 includes a plurality of internal waveguides 712 connecting the subcomponent regions 702. The computational complexity of simulating the photonic integrated circuit 700 is further reduced by using standard shapes and sizes for the internal waveguides 712, and by excluding the internal waveguides 712 themselves from the optimization process. Accordingly, s-parameters for a single internal waveguide 712 may be computed once and then reused during future simulations of the overall photonic integrated circuit 700, dramatically reducing the total area to be simulated while retaining the overall size of the photonic integrated circuit 700 and thereby allowing complex functionality that utilizes the larger overall size to be implemented. The area of the photonic integrated circuit 700 that is neither within the subcomponent regions 702 nor within the internal waveguides 712 may be separated by an opaque barrier and may be ignored during optimization.

The internal waveguides 712 are defined by structural parameters that specify materials within the area of the internal waveguides 712. Though the illustrated internal waveguides 712 are shown as having straight walls and a single material, in some embodiments, the internal waveguides 712 may have more complex structural parameters, including but not limited to regular or irregular features along the walls and/or within the middle of the internal waveguides 712. Further, as discussed above, at least some of the internal waveguides 712 may be curved to connect subcomponent regions 702 that are not horizontally or vertically adjacent.

Though a photonic integrated circuit 700 is illustrated in which the plurality of subcomponent regions 702 are fully connected by pairs of straight internal waveguides 712, it will be understood that this is a non-limiting example only. In some embodiments, more or fewer internal waveguides 712 may be used, and may be arranged in an irregular pattern. Further, in some embodiments, different shapes of internal waveguides 712 may be used, including but not limited to curved internal waveguides 712, such that subcomponent regions 702 other than vertically or horizontally adjacent subcomponent regions 702 may be connected. S-parameters for curved internal waveguides 712 would also be pre-simulated to be plugged in to an overall simulation, as discussed above with respect to the illustrated straight internal waveguides 712.

Figure 8:
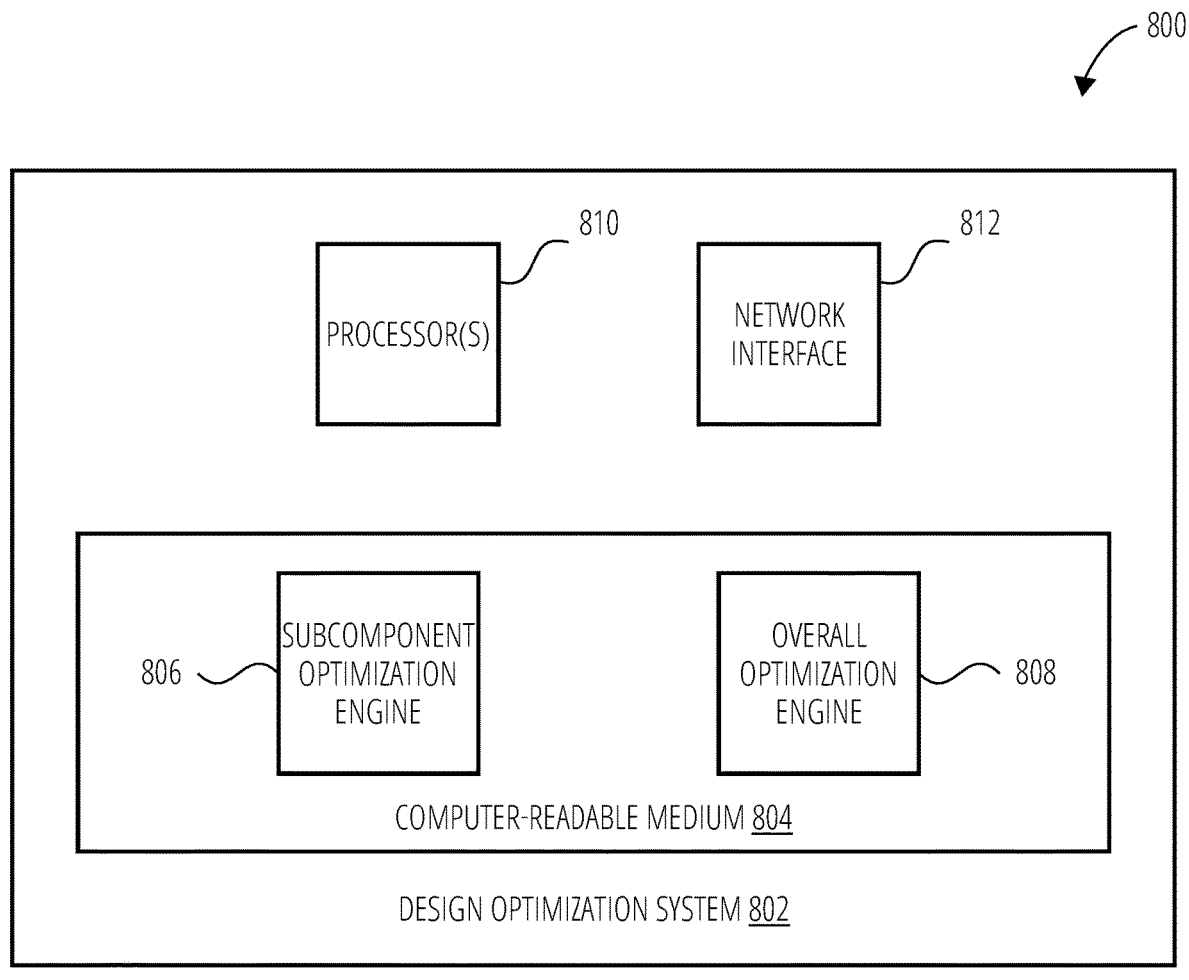
FIG. 8 is a block diagram that illustrates a non-limiting example embodiment of a system according to various aspects of the present disclosure.
Figure 8:
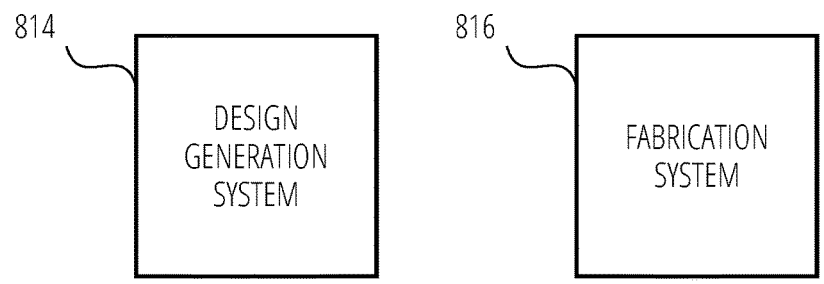

FIG. 8 is a block diagram that illustrates a non-limiting example embodiment of a system according to various aspects of the present disclosure. Overall, the illustrated embodiment of the system 800 is configured to generate proposed segmented designs, to optimize the proposed segmented designs, and to fabricate physical devices based on the proposed segmented designs.

As shown, the system 800 includes a design generation system 814, a fabrication system 816, and a design optimization system 802. Communication between the design generation system 814, the design optimization system 802, and the fabrication system 816 may occur via a network (not pictured), via exchange of a removable computer-readable medium (not pictured), or via any other suitable technique. Though the design generation system 814, fabrication system 816, and design optimization system 802 are illustrated as separate systems, in some embodiments, some portions of these systems may be combined. As one non-limiting example, the design generation system 814 and the design optimization system 802 may be combined in a single system. Also, in some embodiments, systems illustrated in FIG. 8 as a single system may be broken into multiple systems.

In some embodiments, the design generation system 814 may include one or more computing devices that are configured to generate proposed designs that achieve a desired result. For example, the design generation system 814 may provide a user interface that accepts specifications of a number of input ports, a number of output ports, desired functionality of the proposed design (including but not limited to expected outputs at each output port given specific input at each input port), a size of a design region, a number and/or size of subcomponent regions, and/or any other aspect of a proposed design. In some embodiments, the design generation system 814 may generate some aspects of the proposed design automatically, including but not limited to the size and/or number of subcomponent regions 702, a number and/or location of internal waveguides 712 connecting the subcomponent regions 702, etc.

In some embodiments, the fabrication system 816 may be any suitable system for fabricating a segmented design. In some embodiments, the fabrication system 816 may be a photolithography system or an additive manufacturing system. In some embodiments, the fabrication system 816 may have characteristics that include a minimum feature size, a minimum feature shape, and/or other constraints that help define the segmented designs that the fabrication system 816 is capable of fabricating. To that end, the fabrication system 816 may provide a design rule checker that is configured to process proposed segmented designs to determine whether the proposed segmented designs comply with the constraints of the fabrication system 816.

In some embodiments, the design optimization system 802 may be any suitable computing device or collection of computing devices configured to provide the described functionality. In some embodiments, the design optimization system 802 may be a server computing device, a desktop computing device, a laptop computing device, a mobile computing device, a tablet computing device, or one or more computing devices of a cloud computing system. In some embodiments, the design optimization system 802 may include components of or provide functionality described with respect to the system 500 illustrated in FIG. 5 and described above, and/or the system 500 of FIG. 5 may include components of or provide functionality described with respect to the design optimization system 802.

As shown, the design optimization system 802 includes one or more processors 810, a network interface 812, and a computer-readable medium 804. In some embodiments, the one or more processors 810 may include a plurality of processors and/or a plurality of processing cores in order to provide a large amount of computing power. In some embodiments, the network interface 812 may be configured to communicate with the design generation system 814 and/or the fabrication system 816 via any suitable type of wired network (including but not limited to Ethernet, Fire-Wire, and USB), wireless network (including but not limited to 2G, 3G, 4G, 5G, LTE, Wi-Fi, WiMAX, and Bluetooth), or combinations thereof. In some embodiments, instead of a network interface 812, the design optimization system 802 may be configured to communicate with the design generation system 814 and/or the fabrication system 816 via transfer of a removable computer-readable medium (not shown).

As shown, the computer-readable medium 804 has stored thereon logic that, in response to execution by the one or more processors 810, cause the design optimization system 802 to provide a subcomponent optimization engine 806 and an overall optimization engine 808.

In some embodiments, the subcomponent optimization engine 806 is configured to concurrently simulate the subcomponent regions 702 of a proposed segmented design, to determine gradients of the subcomponent regions 702, and to optimize the subcomponent regions 702 based on the gradients. In some embodiments, the overall optimization engine 808 is configured to use the simulations of the subcomponent regions 702 and pre-computed simulations of the internal waveguides 712 to determine overall s-parameters for proposed segmented designs, and to determine overall gradients for the proposed segmented design. In some embodiments, the overall optimization engine 808 is also configured to optimize locations of one or more internal waveguides 712 as part of the optimization process. Further details about the actions performed by the subcomponent optimization engine 806 and the overall optimization engine 808 are provided below.

As used herein, "engine" refers to logic embodied in hardware or software instructions, which can be written in a programming language, such as C, C++, C#, COBOL, JAVA™, PHP, Perl, HTML, CSS, JavaScript, VBScript, ASPX, Go, Python, and/or the like. An engine may be compiled into executable programs or written in interpreted programming languages. Software engines may be callable from other engines or from themselves. Generally, the engines described herein refer to logical modules that can be merged with other engines, or can be divided into sub-engines. The engines can be implemented by logic stored in any type of computer-readable medium or computer storage device and be stored on and executed by one or more general purpose computers, thus creating a special purpose computer configured to provide the engine or the functionality thereof. The engines can be implemented by logic programmed into an application-specific integrated circuit (ASIC), a field-programmable gate array (FPGA), or another hardware device.

As used herein, the term "computer-readable medium" refers to a removable or nonremovable device that implements any technology capable of storing information in a volatile or non-volatile manner to be read by a processor of a computing device, including but not limited to: a hard drive; a flash memory; a solid state drive; random-access memory (RAM); read-only memory (ROM); a CD-ROM, a DVD, or other disk storage; a magnetic cassette; a magnetic tape; and a magnetic disk storage. A computer-readable medium may also include multiple devices configured to collectively store the information described.

Figure 9A:
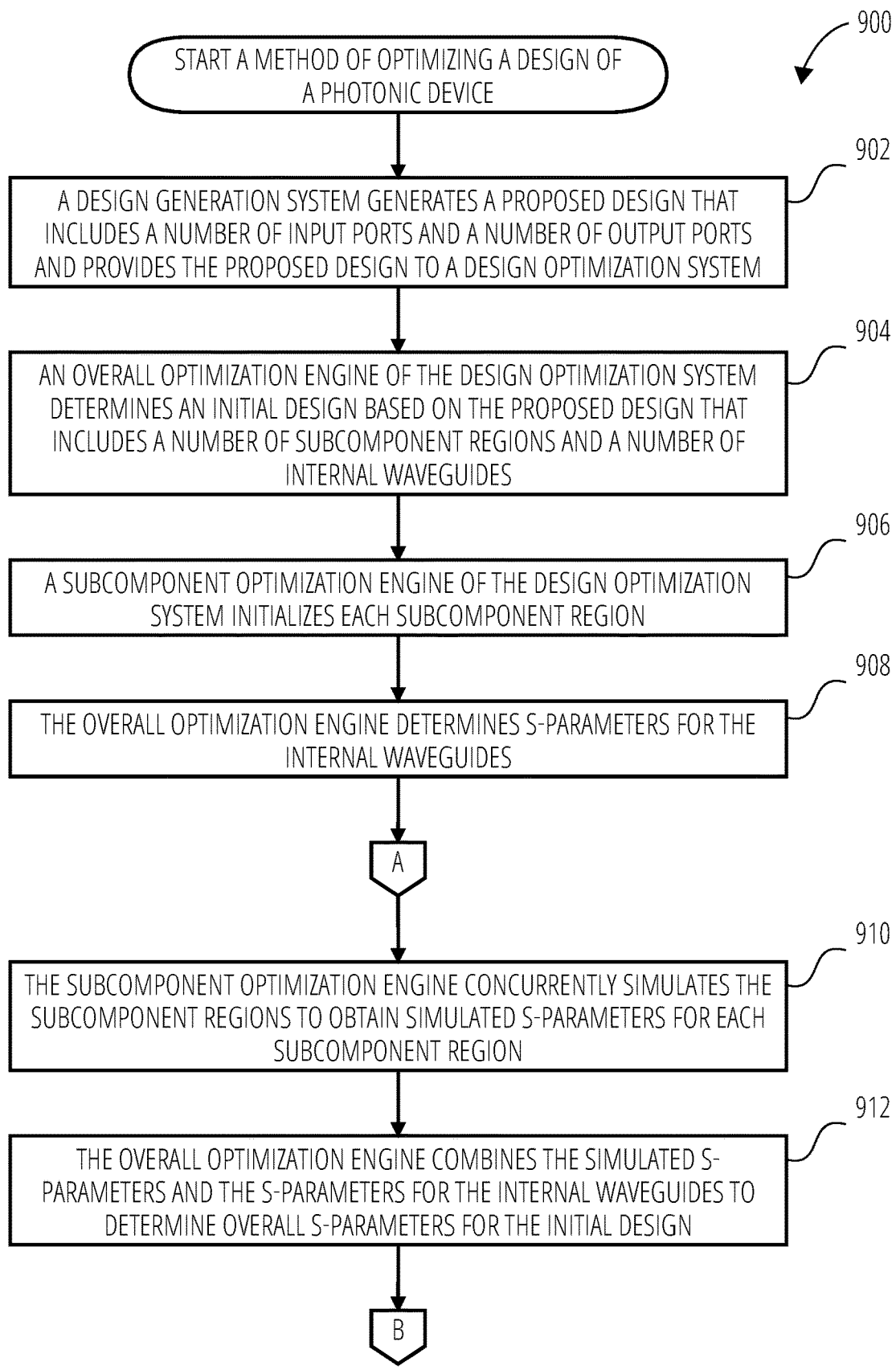
FIG. 9A-FIG. 9B are a flowchart that illustrate a non-limiting example embodiment of a method of optimizing a design of a photonic device according to various aspects of the present disclosure.
Figure 9B:
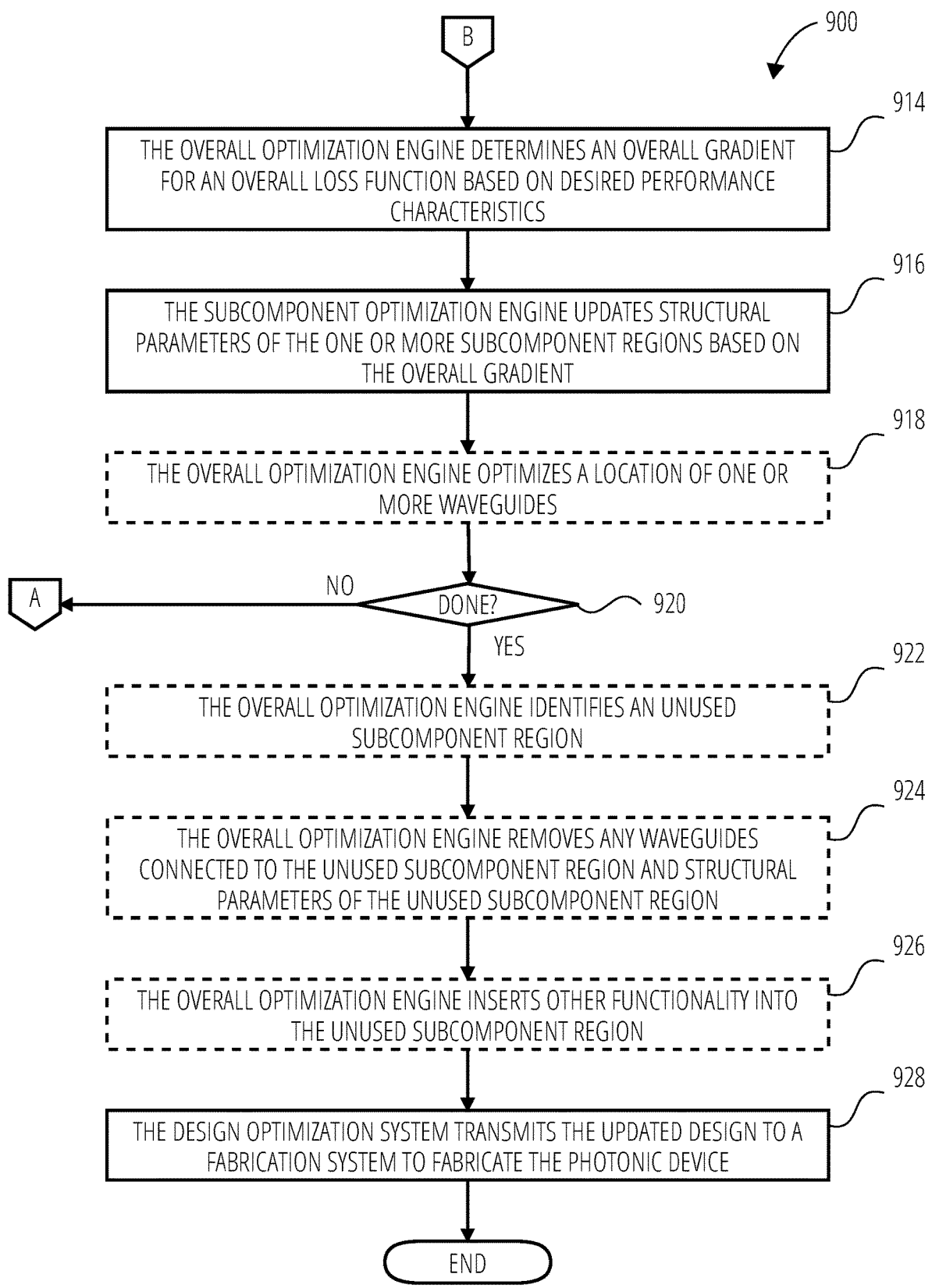

FIG. 9A-FIG. 9B are a flowchart that illustrate a non-limiting example embodiment of a method of optimizing a design of a photonic device according to various aspects of the present disclosure. In the method 900, a design optimization system 802 uses simulation and optimization of subcomponent regions 702, along with pre-computed performance characteristics of internal waveguides 712, to accelerate simulation and optimization of a proposed segmented design for the photonic device.

From a start block, the method 900 proceeds to block 902, where a design generation system 814 generates a proposed design that includes a number of input ports and a number of output ports and provides the proposed design to a design optimization system 802. The proposed design may also include one or more desired performance characteristics associated with each output port for various expected inputs for each input port so that simulated performance can be compared to the desired performance characteristics for purposes of optimization. In some embodiments, the proposed design may indicate one or more constraints for the overall design, including but not limited to a size and/or a shape for the overall design, constraints on locations for one or more of the input ports and/or one or more of the output ports, and/or other constraints.

At block 904, an overall optimization engine 808 of the design optimization system 802 determines an initial design based on the proposed design that includes a number of subcomponent regions 702 and a number of internal waveguides 712. In some embodiments, the number of subcomponent regions 702 may be automatically determined by the overall optimization engine 808. For example, the overall optimization engine 808 may retrieve a size and/or a shape for the overall design from the proposed design, and may automatically divide an initial design based on the size and/or shape into subcomponent regions 702 of a predetermined size. As another example, the overall optimization engine 808 may retrieve the size and/or the shape for the overall design from the proposed design, and may automatically divide an initial design based on the size and/or shape into a predetermined number of subcomponent regions 702 spaced apart by predetermined amounts. In some embodiments, specifications for the subcomponent regions 702 and/or the internal waveguides 712 may be provided within the proposed design.

In some embodiments, the proposed design may provide a number of internal waveguides 712 to be used to connect each of the subcomponent regions 702. For example, for a proposed design for the photonic integrated circuit 700 illustrated in FIG. 7, two internal waveguides 712 would have been specified to connect each of the subcomponent regions 702. In some embodiments, the proposed design may indicate more or fewer internal waveguides 712 to connect each of the subcomponent regions 702. In some embodiments, the proposed design may also specify shapes for the internal waveguides 712 (e.g., straight, curved, etc.). In some embodiments, the proposed design may indicate that fewer than all of the subcomponent regions 702 should be fully connected in the initial design, such that some subcomponent regions 702 may be connected by more or fewer internal waveguides 712 than others. In some embodiments, the proposed design may provide specific locations for the internal waveguides 712. In some embodiments, the overall optimization engine 808 may determine specific locations for the internal waveguide 712 based on guidance provided by the proposed design. In some embodiments, the overall optimization engine 808 may automatically determine both numbers and locations for the internal waveguides 712.

At block 906, a subcomponent optimization engine 806 of the design optimization system 802 initializes each subcomponent region. In some embodiments, initialization includes determining an initial set of structural parameters (e.g., a pattern of materials in the voxels 612 (e.g., pixels, segments)) for each subcomponent region 702. In some embodiments, the initialization may set the materials in the voxels 612 to a single value. In some embodiments, the initialization may set the materials in the voxels 612 to random values. In some embodiments, the initialization may set the materials in the voxels 612 to match structural parameters of a previously designed physical device.

At block 908, the overall optimization engine 808 determines s-parameters for the internal waveguides 712. In some embodiments, the overall optimization engine 808 may determine s-parameters by simulating performance of a sample internal waveguide using an FDTD method, an FDFD method, or any other suitable method that generates s-parameters for the sample internal waveguide. The s-parameters determined for that sample internal waveguide may then be used for each of the internal waveguides 712 used in the design. S-parameters may be determined separately for each type of internal waveguide used in the design (e.g., a straight internal waveguide of a given length, a curved internal waveguide, etc.), but may be reused each time an internal waveguide of the same size and shape is used in the design. In some embodiments, the overall optimization engine 808 may store the s-parameters for the internal waveguide in a reference data store. In some embodiments, the overall optimization engine 808 may determine the s-parameters for the internal waveguides 712 by retrieving previously determined s-parameters from a reference data store.

The method 900 then proceeds through a continuation terminal ("terminal A") to block 910, where the subcomponent optimization engine 806 concurrently simulates the subcomponent regions to obtain simulated s-parameters for each subcomponent region. The structural parameters for each subcomponent region 702 may be used for a simulation using an FDTD method, an FDFD method, or any other suitable method to generate the simulated s-parameters. Any suitable technique may be used to concurrently simulate the subcomponent regions 702. For example, a multithreaded approach may be used to concurrently execute multiple simulations on one or more processing cores. As another example, a serverless function or other distributed computing technique may be used to distribute the simulations for each subcomponent region 702 amongst a plurality of cloud-based computing devices. By using subcomponent regions 702 of matching sizes, the simulations will take substantially similar amounts of time to complete, and no one simulation will serve as a bottleneck.

At block 912, the overall optimization engine 808 combines the simulated s-parameters and the s-parameters for the internal waveguides 712 to determine overall s-parameters for the initial design. One characteristic of s-parameters known to those of ordinary skill in the art is that s-parameters of complex circuits can be modeled by combining the s-parameters of individual components with a simple operation such as a matrix multiplication, a more complex technique such as the Gunnar Algorithm described in Filipsson, Gunnar, "A new general computer algorithm for S-matrix calculation of interconnected multiports," 11th European Microwave Conference, IEEE, 1981 (hereby incorporated by reference herein in its entirety), or any other suitable technique. Accordingly, by appropriately combining the simulated s-parameters for the subcomponent regions 702 and the s-parameters for the internal waveguide 712, overall s-parameters can be easily determined. In some embodiments, s-parameters for the input port(s) and the output port(s) may be considered as well.

The method 900 then proceeds to a continuation terminal ("terminal B"). From terminal B (FIG. 9B), the method 900 proceeds to block 914, where the overall optimization engine 808 determines an overall gradient for an overall loss function based on desired performance characteristics. In some embodiments, a comparison between a desired performance and the overall s-parameters may be performed to determine a performance loss value. A derivative of the performance loss value may be determined to calculate the overall gradient.

At block 916, the subcomponent optimization engine 806 updates structural parameters of the one or more subcomponent regions based on the overall gradient. In some embodiments, the overall gradient indicates changes to be made to the structural parameters within the entire design region 614 in order to reduce the difference between the overall performance loss value and the desired performance. The changes indicated by the overall gradient are mapped to the appropriate subcomponent regions 702 so that appropriate changes to the subcomponent regions 702 can be made. Since all of the subcomponent regions 702 can be updated using the single overall gradient, the effect is that of optimizing all of the subcomponent regions 702 at once, instead of using individual optimizations of each subcomponent region 702. Accordingly, a dramatic conservation of computing resources in obtained by eliminating the separate optimizations of the subcomponent regions 702.

In some embodiments, all of the subcomponent regions 702 may be optimized each time block 916 is reached in the method 900. In some embodiments, a subset of subcomponent regions 702 may be optimized during each iteration of block 916. For example, a first level of subcomponent regions 702 (i.e., subcomponent regions 702 closest to the output ports) may be optimized during a first iteration, a second level of subcomponent regions 702 (i.e., a set of subcomponent regions 702 directly upstream from the first level of subcomponent regions 702) may be optimized during a second iteration, and so on. Similarly, each subset may be processed for more than one iteration before moving on to the next subset.

At optional block 918, the overall optimization engine 808 optimizes a location of one or more waveguides. In some embodiments, the overall optimization engine 808 may determine whether the overall performance would be improved by moving a location of one or more of the internal waveguides 712, input ports, and/or output ports. This may be accomplished via monitoring performance values along perimeters of the photonic integrated circuit 700 and/or the individual subcomponent regions 702, and moving waveguides if it is determined by the overall optimization engine 808 that performance is better with waveguides at a different location. Detailed descriptions of techniques for moving waveguide locations are provided in commonly owned, co-pending U.S. application Ser. No. 17/586,370, filed Jan. 27, 2022, the entire disclosure of which is hereby incorporated by reference herein in its entirety for all purposes.

In some embodiments, the overall optimization engine 808 may review field values within neighboring subcomponent regions 702, and if it is determined that signal strength passing through the waveguide is less than a threshold amount, then the associated waveguide may be removed from the design in order to simplify future calculations. Optional block 918 is illustrated as optional because in some embodiments, the locations of the waveguides may be fixed, and/or because the optimization of the waveguide locations may not be performed during every iteration of the method 900.

The method 900 then proceeds to decision block 920, where a determination is made regarding whether the method 900 is done optimizing the design. In some embodiments, the optimization may continue until a desired level of performance is obtained. In some embodiments, the optimization may continue until a performance loss value converges to a local minimum (i.e., further iterations are not expected to further improve performance). In some embodiments, the optimization may be performed for a predetermined number of iterations, and the determination may check whether that number of iterations has been performed yet.

If it is determined at decision block 920 that the method 900 is not done, then the result of decision block 920 is NO, and the method 900 returns to block 910 via terminal A to perform a subsequent optimization iteration. Otherwise, if the method 900 is done, then the result of decision block 920 is YES, and the method 900 proceeds to optional block 922.

At optional block 922, the overall optimization engine 808 identifies an unused subcomponent region. In some embodiments, the overall optimization engine 808 may review simulated field values within the subcomponent regions 702 (as determined during the simulation at block 910) to determine whether there are subcomponent regions 702 which do not receive any signal during operation of the photonic integrated circuit 700. In some embodiments, the overall optimization engine 808 may identify unused subcomponent regions 702 by finding subcomponent regions 702 that have had all waveguides removed by the processing at optional block 918.

At optional block 924, the overall optimization engine 808 removes any waveguides connected to the unused subcomponent region 702 and structural parameters of the unused subcomponent region 702. Since no signal had been reaching the unused subcomponent region 702, the structural parameters and waveguides leading thereto (if any remained after processing at optional block 918) can be removed without affecting the performance of the remainder of the photonic integrated circuit 700.

At optional block 926, the overall optimization engine 808 inserts other functionality into the unused subcomponent region. In some embodiments, a predetermined test structure with its own input port and output port can be inserted to replace the removed subcomponent region 702. This is advantageous because it provides a structure that may be used to test the manufacturing process of the rest of the photonic integrated circuit 700 as physically close as possible to the photonic integrated circuit 700, and does not require reserving space within the photonic integrated circuit 700 that would otherwise be useful for providing the functionality of the photonic integrated circuit 700. In some embodiments, the "other functionality" may be inserted by laying out multiple photonic integrated circuits 700 on a single wafer such that the unused portions of the photonic integrated circuits 700 interlace with each other in order to fit more photonic integrated circuits 700 onto a single wafer. Optional blocks 922, 924, and 926 are illustrated as optional because in some embodiments, the method 900 may leave unused subcomponent regions 702 within the photonic integrated circuit 700.

At block 928, the design optimization system 802 transmits the updated design to a fabrication system 816 to fabricate the photonic device. The fabrication system 816, in turn, may fabricate the photonic device as defined by the updated design.

The method 900 then proceeds to an end block and terminates.

In the preceding description, numerous specific details are set forth to provide a thorough understanding of various embodiments of the present disclosure. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The order in which some or all of the blocks appear in each method flowchart should not be deemed limiting. Rather, one of ordinary skill in the art having the benefit of the present disclosure will understand that actions associated with some of the blocks may be executed in a variety of orders not illustrated, or even in parallel.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A non-transitory computer-readable medium having logic stored thereon that, in response to execution by one or more processors of a computing system cause the computing system to perform actions for designing a photonic device, the actions comprising:

receiving, by a design optimization system, an initial design for the photonic device, wherein the initial design includes one or more inputs, one or more outputs, a number of subcomponent regions, and a number of waveguides for connecting the subcomponent regions;

simulating, by the design optimization system, each subcomponent region to determine simulated s-parameters of each subcomponent region;

determining, by the design optimization system, overall s-parameters for a simulated photonic device based on the simulated s-parameters of each subcomponent region and s-parameters of the waveguides;

determining, by the design optimization system, an overall gradient associated with the overall s-parameters; and optimizing, by the design optimization system, one or more subcomponent regions based on the overall gradient to create an updated design for the photonic device.

2. The non-transitory computer-readable medium of claim 1, wherein the actions further comprise:

repeating the simulating, determining, and optimizing actions until simulated performance of the simulated photonic device reaches a predetermined threshold or until a predetermined number of iterations has been performed.

3. The non-transitory computer-readable medium of claim 1, wherein the actions further comprise:

providing the updated design to a fabrication system to fabricate the photonic device.

4. The non-transitory computer-readable medium of claim 1, wherein the actions further comprise:

retrieving predetermined s-parameters of the waveguides; and wherein determining the overall s-parameters for the simulated photonic device based on the simulated s-parameters of each subcomponent region and the s-parameters of the waveguides includes using the retrieved predetermined s-parameters of the waveguides.

5. The non-transitory computer-readable medium of claim 1, wherein simulating each subcomponent region to determine simulated s-parameters of each subcomponent region includes concurrently simulating each subcomponent region.

6. The non-transitory computer-readable medium of claim 1, wherein optimizing a subcomponent region includes updating at least one of a size of the subcomponent region or structural parameters of the subcomponent region.

7. The non-transitory computer-readable medium of claim 1, wherein the actions further comprise:

optimizing at least one of a position or a shape of at least one waveguide.

8. The non-transitory computer-readable medium of claim 7, wherein optimizing at least one of the position or the shape of at least one waveguide includes removing at least one waveguide.

9. The non-transitory computer-readable medium of claim 8, wherein the actions further comprise:

in response to determining that a subcomponent region is not connected to any waveguides, removing the subcomponent region from the updated design.

10. The non-transitory computer-readable medium of claim 9, wherein the actions further comprise:

inserting a predetermined test structure to replace the removed subcomponent region.

11. A method for designing a photonic device, the method comprising:

receiving, by a design optimization system, an initial design for the photonic device, wherein the initial design includes one or more inputs, one or more outputs, a number of subcomponent regions, and a number of waveguides for connecting the subcomponent regions;

simulating, by the design optimization system, each subcomponent region to determine simulated s-parameters of each subcomponent region;

determining, by the design optimization system, overall s-parameters for a simulated photonic device based on the simulated s-parameters of each subcomponent region and s-parameters of the waveguides;

determining, by the design optimization system, an overall gradient associated with the overall s-parameters; and optimizing, by the design optimization system, one or more subcomponent regions based on the overall gradient to create an updated design for the photonic device.

12. The method of claim 11, further comprising:

repeating the simulating, determining, and optimizing actions until simulated performance of the simulated photonic device reaches a predetermined threshold or until a predetermined number of iterations has been performed.

13. The method of claim 11, further comprising:

providing the updated design to a fabrication system to fabricate the photonic device.

14. The method of claim 11, further comprising:

retrieving predetermined s-parameters of the waveguides; and wherein determining the overall s-parameters for the simulated photonic device based on the simulated s-parameters of each subcomponent region and the s-parameters of the waveguides includes using the retrieved predetermined s-parameters of the waveguides.

15. The method of claim 11, wherein simulating each subcomponent region to determine simulated s-parameters of each subcomponent region includes concurrently simulating each subcomponent region.

16. The method of claim 11, wherein optimizing a subcomponent region includes updating at least one of a size of the subcomponent region or structural parameters of the subcomponent region.

17. The method of claim 11, further comprising:

optimizing at least one of a position or a shape of at least one waveguide.

18. The method of claim 17, wherein optimizing at least one of the position or the shape of at least one waveguide includes removing at least one waveguide.

19. The method of claim 18, further comprising:

in response to determining that a subcomponent region is no longer connected to any waveguides, removing the subcomponent region from the updated design.

20. The method of claim 19, further comprising:

adding a predetermined test structure to replace the removed subcomponent region.

* * * * *